(12) United States Patent
Yamamoto

(10) Patent No.: US 7,965,128 B2
(45) Date of Patent: Jun. 21, 2011

(54) SEMICONDUCTOR DEVICE, AND POWER SOURCE AND PROCESSOR PROVIDED WITH THE SAME

(75) Inventor: Kenji Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 76 days.

(21) Appl. No.: 12/594,038

(22) PCT Filed: Nov. 6, 2008

(86) PCT No.: PCT/JP2008/070225
§ 371 (c)(1),
(2), (4) Date: Sep. 30, 2009

(87) PCT Pub. No.: WO2009/060907
PCT Pub. Date: May 14, 2009

(65) Prior Publication Data
US 2010/0109752 A1    May 6, 2010

(30) Foreign Application Priority Data

Nov. 8, 2007    (JP) .................................. 2007-291101

(51) Int. Cl.
*H01L 35/00* (2006.01)
(52) U.S. Cl. ....................................... 327/512; 327/513
(58) Field of Classification Search .................. 327/512, 327/513
See application file for complete search history.

(56) References Cited

U.S. PATENT DOCUMENTS

| | | | | |
|---|---|---|---|---|
| 5,859,560 | A * | 1/1999 | Matthews | 327/513 |
| 6,225,851 | B1 * | 5/2001 | Descombes | 327/512 |
| 6,687,107 | B2 | 2/2004 | Yamamoto et al. | |
| 6,851,849 | B2 | 2/2005 | Kimura | |
| 7,592,854 | B2 * | 9/2009 | Watanabe | 327/512 |
| 2002/0186067 | A1 | 12/2002 | Yamamoto et al. | |
| 2003/0038332 | A1 | 2/2003 | Kimura | |
| 2004/0145021 | A1 | 7/2004 | Yamamoto et al. | |

FOREIGN PATENT DOCUMENTS

| | | |
|---|---|---|
| JP | 02-260914 | 10/1990 |
| JP | 06-169222 | 6/1994 |
| JP | 2001-264176 | 9/2001 |
| JP | 2002-368110 | 12/2002 |
| JP | 2006-047039 | 2/2006 |

* cited by examiner

Primary Examiner — Hai L Nguyen
(74) Attorney, Agent, or Firm — Fish & Richardson P.C.

(57) ABSTRACT

A semiconductor device includes: a transistor having a first electrode coupled to a first power source node to which a first power source voltage is supplied, and a second electrode, and supplying a reference current to a temperature detection element; a diffused resistor including a first semiconductor region having a potential-fixing node coupled to the first power source node, and a second semiconductor region having a first resistor node coupled to the second electrode of the transistor and a second resistor node coupled to a second power source node to which a second power source voltage is supplied, and formed at a surface of the first semiconductor region; and a leakage current correction circuit for allowing a current having approximately the same magnitude and the same direction as a magnitude and a direction of a current flowing via the potential-fixing node and the second resistor node, to flow not via the diffused resistor but via the transistor.

18 Claims, 7 Drawing Sheets

SEMICONDUCTOR DEVICE, AND POWER SOURCE AND PROCESSOR PROVIDED WITH THE SAME

TECHNICAL FIELD

The present invention relates to a semiconductor device, and a power source and a processor each provided with the same, and particularly relates to a semiconductor device that detects a temperature, and a power source and a processor each provided with the same.

BACKGROUND ART

As a conventional configuration for detecting a temperature, Patent Document 1 (Japanese Patent Laying-Open No. 2006-047039), for example, discloses a temperature sensing circuit as described below. In other words, the temperature sensing circuit in which at least one diode is embedded in a semiconductor substrate provided with an object, a temperature of which is to be sensed, includes a depletion-mode MOS transistor for supplying a forward current to a diode, first voltage comparing means that has a plurality of selective threshold values and serves for receiving the forward voltage of the diode, and second voltage comparing means that has a comparative reference voltage different from the threshold values of the first voltage comparing means and serves for amplifying an output of the first voltage comparing means and outputting the amplified output.

Patent Document 1: Japanese Patent Laying-Open No. 2006-047039

DISCLOSURE OF THE INVENTION

Problems to be Solved by the Invention

To accurately detect temperatures in a wider range, it is desirable, in the temperature detection circuit, that a reference current to be supplied to a temperature detection element such as a diode, and a reference voltage to be used for being compared with a forward voltage of the diode is constant with respect to temperature changes.

In a semiconductor circuit where a transistor and the like are formed, however, a leakage current is usually generated. The leakage current has temperature characteristics, and hence once the leakage current is generated in the temperature detection circuit, the temperature detection accuracy is degraded, so that temperatures in a wide range cannot be detected accurately.

In the temperature sensing circuit described in Patent Document 1, a leakage current is generated in the depletion-mode MOS transistor, the diode, and the like. However, suppressing degradation in temperature detection accuracy caused by the leakage current is not considered.

Accordingly, an object of the present invention is to provide a semiconductor device capable of accurately detecting temperatures in a wide range by suppressing degradation in temperature detection accuracy caused by a leakage current, and a power source and a processor each provided with the same.

Means for Solving the Problems

A semiconductor device according to an aspect of the present invention includes: a temperature detection element, a voltage to be applied to the temperature detection element so as to allow a current greater than or equal to a prescribed value to flow through the temperature detection element changing in accordance with an ambient temperature; and a constant current source for applying a voltage to the temperature detection element so as to allow a reference current greater than or equal to the prescribed value to flow through the temperature detection element. The constant current source includes a reference current transistor having a first conductive electrode coupled to a first power source node to which a first power source voltage is supplied, and a second conductive electrode, and outputting the reference current, and a first diffused resistor. The first diffused resistor includes a first semiconductor region of a first conductivity type, having a first potential-fixing node coupled to the first power source node, and a second semiconductor region of a second conductivity type, having a first resistor node coupled to the second conductive electrode of the reference current transistor and a second resistor node coupled to a second power source node to which a second power source voltage is supplied, and formed to be spaced apart from the first potential-fixing node at a surface of the first semiconductor region. The semiconductor device further includes a first leakage current correction circuit for allowing a current having approximately the same magnitude and the same direction as a magnitude and a direction of a current flowing between the first power source node and the second power source node via the first potential-fixing node and the second resistor node, to flow between the first power source node and the second power source node, not via the first diffused resistor but via the reference current transistor.

Preferably, the first leakage current correction circuit includes a first mirror circuit including a reference-side transistor connected between the first power source node and the first potential-fixing node, and an output-side transistor connected between the first power source node and the second power source node, and a second mirror circuit including a reference-side transistor connected between the first power source node and the second power source node via the output-side transistor in the first mirror circuit, and an output-side transistor connected between the second conductive electrode of the reference current transistor and the second power source node.

More preferably, the first diffused resistor further includes a third semiconductor region of the second conductivity type, coupled to the second power source node and having a surface at which the first semiconductor region is formed. The first leakage current correction circuit further includes a fourth semiconductor region of the first conductivity type, coupled to a node between the output-side transistor in the first mirror circuit and the reference-side transistor in the second mirror circuit, and a fifth semiconductor region of the second conductivity type, coupled to the second power source node and having a surface at which the fourth semiconductor region is formed.

More preferably, a value obtained by multiplying a contact area of the first semiconductor region and the third semiconductor region by a mirror ratio of the second mirror circuit is approximately equal to a contact area of the fourth semiconductor region and the fifth semiconductor region.

Preferably, the reference current transistor includes a sixth semiconductor region of the second conductivity type, coupled to the second power source node, a seventh semiconductor region of the first conductivity type, formed at a surface of the sixth semiconductor region and coupled to the first power source node, an eighth semiconductor region of the second conductivity type, formed at a surface of the seventh semiconductor region, and a ninth semiconductor region of the first conductivity type, formed at a surface of the eighth semiconductor region and coupled to the first resistor node of the first diffused resistor. The semiconductor device further includes a second leakage current correction circuit for allowing a current having approximately the same magnitude and the same direction as a magnitude and a direction of a current flowing between the first power source node and the second power source node via the sixth semiconductor region and the seventh semiconductor region, to flow between the first power source node and the second power source node via the seventh semiconductor region, the eighth semiconductor region, and the ninth semiconductor region.

Preferably, the reference current transistor includes a sixth semiconductor region of the second conductivity type, coupled to the second power source node, a seventh semiconductor region of the first conductivity type, formed at a surface of the sixth semiconductor region and coupled to the first power source node, an eighth semiconductor region of the second conductivity type, formed at a surface of the seventh semiconductor region, and a ninth semiconductor region of the first conductivity type, formed at a surface of the eighth semiconductor region and coupled to the first diffused resistor. The semiconductor device further includes a second leakage current correction circuit. The second leakage current correction circuit includes a tenth semiconductor region of the first conductivity type, coupled to the first power source node, an eleventh semiconductor region of the second conductivity type, coupled to the second power source node and having a surface at which the tenth semiconductor region is formed, and a third mirror circuit including a reference-side transistor connected between the first power source node and the tenth semiconductor region, and an output-side transistor connected between the first power source node and the seventh semiconductor region.

Preferably, the temperature detection element includes a twelfth semiconductor region of the second conductivity type, coupled to the second power source node, a thirteenth semiconductor region of the first conductivity type, formed at a surface of the twelfth semiconductor region and coupled to the first power source node, a fourteenth semiconductor region of the second conductivity type, formed at a surface of the thirteenth semiconductor region and coupled to the first power source node, and a fifteenth semiconductor region of the first conductivity type, formed at a surface of the fourteenth semiconductor region and coupled to the second power source node. The semiconductor device further includes a third leakage current correction circuit for allowing a current having approximately the same magnitude and the same direction as a magnitude and a direction of a current flowing between the first power source node and the second power source node via the twelfth semiconductor region and the thirteenth semiconductor region, to flow between the first power source node and the second power source node via the fourteenth semiconductor region and the fifteenth semiconductor region.

Preferably, the temperature detection element includes a twelfth semiconductor region of the second conductivity type, coupled to the second power source node, a thirteenth semiconductor region of the first conductivity type, formed at a surface of the twelfth semiconductor region and coupled to the first power source node, a fourteenth semiconductor region of the second conductivity type, formed at a surface of the thirteenth semiconductor region and coupled to the first power source node, and a fifteenth semiconductor region of the first conductivity type, formed at a surface of the fourteenth semiconductor region and coupled to the second power source node. The semiconductor device further includes a third leakage current correction circuit. The third leakage current correction circuit includes a sixteenth semiconductor region of the first conductivity type, coupled to the first power source node, and a seventeenth semiconductor region of the second conductivity type, coupled to the second power source node and having a surface at which the sixteenth semiconductor region is formed, and a fourth mirror circuit having a reference-side transistor connected between the first power source node and the sixteenth semiconductor region, and an output-side transistor connected between the first power source node, and the thirteenth semiconductor region and the fourteenth semiconductor region.

Preferably, the semiconductor device further includes a second diffused resistor for converting the reference current to generate a reference voltage. The second diffused resistor includes an eighteenth semiconductor region of the first conductivity type, having a second potential-fixing node coupled to the first power source node, and a nineteenth semiconductor region of the second conductivity type, having a third resistor node coupled to the reference current transistor and a fourth resistor node coupled to the second power source node to which the second power source voltage is supplied, and formed to be spaced apart from the second potential-fixing node at a surface of the eighteenth semiconductor region. The semiconductor device further includes a fourth leakage current correction circuit for allowing a current having approximately the same magnitude and the same direction as a magnitude and a direction of a current flowing between the first power source node and the second power source node via the second potential-fixing node and the fourth resistor node, to flow between the first power source node and the second power source node, not via the fourth resistor node but via the third resistor node.

More preferably, the fourth leakage current correction circuit includes a fifth mirror circuit having a reference-side transistor connected between the first power source node and the second potential-fixing node, and an output-side transistor connected between the first power source node and the second power source node, and a sixth mirror circuit having a reference-side transistor connected between the first power source node and the second power source node via the output-side transistor in the fifth mirror circuit, and an output-side transistor connected between the third resistor node and the second power source node.

More preferably, the second diffused resistor further includes a twentieth semiconductor region of the second conductivity type, coupled to the second power source node and having a surface at which the eighteenth semiconductor region is formed. The fourth leakage current correction circuit further includes a twenty-first semiconductor region of the first conductivity type, coupled to a node between the output-side transistor in the fifth mirror circuit and the reference-side transistor in the sixth mirror circuit, and a twenty-second semiconductor region of the second conductivity type, coupled to the second power source node and having a surface at which the twenty-first semiconductor region is formed.

More preferably, the first leakage current correction circuit and the fourth leakage current correction circuit include a first mirror circuit having a reference-side transistor connected between the first power source node, and the first potential-fixing node and the second potential-fixing node, and a first output-side transistor connected between the first power source node and the second power source node, and a second mirror circuit having a reference-side transistor connected between the first power source node and the second power source node via the output-side transistor in the first mirror circuit, a first output-side transistor connected between the second conductive electrode of the reference current transistor and the second power source node, and a second output-side transistor connected between the third resistor node and the second power source node.

Preferably, the semiconductor device further includes a first reference voltage generation circuit for generating a first reference voltage based on the reference current, a second reference voltage generation circuit for generating a plurality of second reference voltages based on the first reference voltage, a reference voltage selection circuit for selecting any one of the plurality of second reference voltages, and a comparison unit for comparing the voltage applied to the temperature detection element by the constant current source with the selected second reference voltage.

More preferably, the semiconductor device further includes a control terminal, and a control signal generation circuit for generating a control signal based on a potential state of the control terminal. The control signal generation circuit includes a voltage follower circuit having an input terminal for receiving an intermediate voltage and an output terminal coupled to the control terminal, a first comparator circuit having a first input terminal for receiving a first control voltage higher than the intermediate voltage, and a second input terminal coupled to the output terminal of the voltage follower circuit, comparing a voltage of the first input terminal with a voltage of the second input terminal, and outputting a first control signal indicating the comparison result to the reference voltage selection circuit, and a second comparator circuit having a first input terminal for receiving a second control voltage lower than the intermediate voltage, and a second input terminal coupled to the output terminal of the voltage follower circuit, comparing a voltage of the first input terminal with a voltage of the second input terminal, and outputting a second control signal indicating the comparison result to the reference voltage selection circuit. The reference voltage selection circuit selects any one of the plurality of second reference voltages based on the first control signal and the second control signal.

More preferably, the second reference voltage generation circuit further generates the intermediate voltage, the first control voltage, and the second control voltage based on the first reference voltage.

A semiconductor device according to another aspect of the present invention includes: a temperature detection element, a voltage to be applied to the temperature detection element so as to allow a current greater than or equal to a prescribed value to flow through the temperature detection element changing in accordance with an ambient temperature; a constant current source for applying a voltage to the temperature detection element so as to allow a reference current greater than or equal to the prescribed value to flow through the temperature detection element; and a diffused resistor for converting the reference current to generate a reference voltage. The diffused resistor includes a first semiconductor region of a first conductivity type, having a potential-fixing node coupled to a first power source node to which a first power source voltage is supplied, and a second semiconductor region of a second conductivity type, having a first resistor node coupled to the reference current transistor and a second resistor node coupled to a second power source node to which a second power source voltage is supplied, and formed to be spaced apart from the potential-fixing node at a surface of the first semiconductor region. The semiconductor device further includes a leakage current correction circuit for allowing a current having approximately the same magnitude and the same direction as a magnitude and a direction of a current flowing between the first power source node and the second power source node via the potential-fixing node and the second resistor node, to flow between the first power source node and the second power source node, not via the second resistor node but via the first resistor node.

A power source according to an aspect of the present invention includes: a voltage generation circuit; and a semiconductor device for detecting a temperature of the voltage generation circuit. The semiconductor device includes a temperature detection element, a voltage to be applied to the temperature detection element so as to allow a current greater than or equal to a prescribed value to flow through the temperature detection element changing in accordance with an ambient temperature, and a constant current source for applying a voltage to the temperature detection element so as to allow a reference current greater than or equal to the prescribed value to flow through the temperature detection element. The constant current source includes a reference current transistor having a first conductive electrode coupled to a first power source node to which a first power source voltage is supplied, and a second conductive electrode, and outputting the reference current, and a diffused resistor. The diffused resistor includes a first semiconductor region of a first conductivity type, having a potential-fixing node coupled to the first power source node, and a second semiconductor region of a second conductivity type, having a first resistor node coupled to the second conductive electrode of the reference current transistor and a second resistor node coupled to a second power source node to which a second power source voltage is supplied, and formed to be spaced apart from the potential-fixing node at a surface of the first semiconductor region. The semiconductor device further includes a leakage current correction circuit for allowing a current having approximately the same magnitude and the same direction as a magnitude and a direction of a current flowing between the first power source node and the second power source node via the potential-fixing node and the second resistor node, to flow between the first power source node and the second power source node, not via the diffused resistor but via the reference current transistor.

A processor according to an aspect of the present invention includes: a CPU; and a semiconductor device for detecting a temperature of the CPU. The semiconductor device includes a temperature detection element, a voltage to be applied to the temperature detection element so as to allow a current greater than or equal to a prescribed value to flow through the temperature detection element changing in accordance with an ambient temperature, and a constant current source for applying a voltage to the temperature detection element so as to allow a reference current greater than or equal to the prescribed value to flow through the temperature detection element. The constant current source includes a reference current transistor having a first conductive electrode coupled to a first power source node to which a first power source voltage is supplied, and a second conductive electrode, and outputting the reference current, and a diffused resistor. The diffused resistor includes a first semiconductor region of a first conductivity type, having a potential-fixing node coupled to the first power source node, and a second semiconductor region of a second conductivity type, having a first resistor node coupled to the second conductive electrode of the reference current transistor and a second resistor node coupled to a second power source node to which a second power source voltage is supplied, and formed to be spaced apart from the potential-fixing node at a surface of the first semiconductor region. The semiconductor device further includes a leakage current correction circuit for allowing a current having approximately the same magnitude and the same direction as a magnitude and a direction of a current flowing between the first power source node and the second power source node via the potential-fixing node and the second resistor node, to flow between the first power source node and the second power source node, not via the diffused resistor but via the reference current transistor.

EFFECTS OF THE INVENTION

According to the present invention, it is possible to accurately detect temperatures in a wide range by suppressing degradation in temperature detection accuracy caused by a leakage current.

Figure 1:
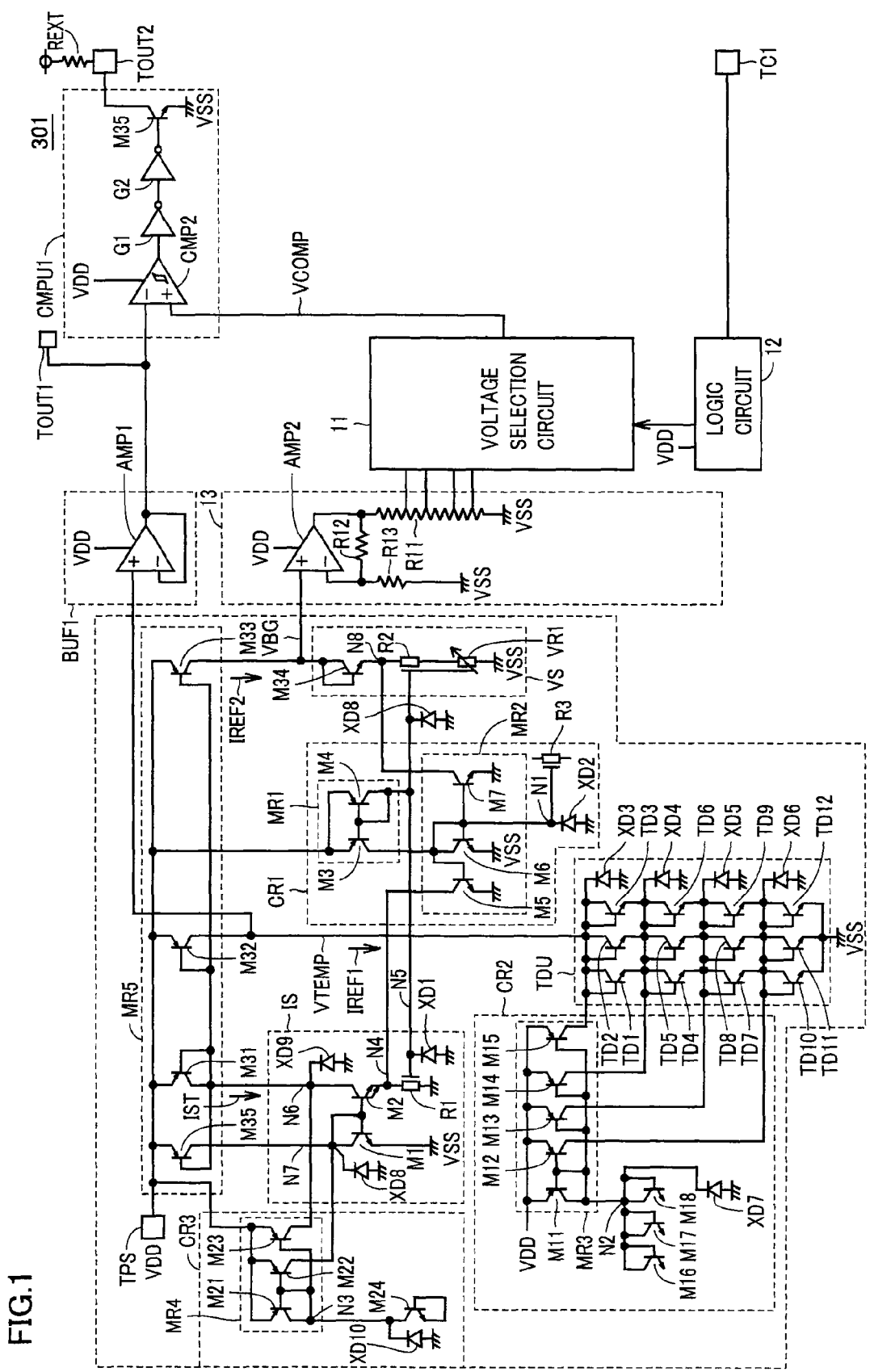
FIG. 1 is a diagram that shows a configuration of a semiconductor device according to a first embodiment of the present invention.

DESCRIPTION OF THE REFERENCE SIGNS 11, 21: voltage selection circuit, 12, 22: logic circuit, 13, 23: second reference voltage generation circuit, 24: control signal generation unit, 51, 71, 91, 111, 151, 171, 191, 211: p-type substrate (semiconductor region), 52, 72, 92, 112, 152, 172, 192, 212: n-type diffused region, 53, 73, 76, 93, 96, 113, 153, 173, 176, 193, 196, 213, 216: n+-type diffused region, 54, 74, 94, 114, 154, 174, 194, 214: p--type diffused region, 55, 56, 75, 95, 115, 116, 155, 156, 175, 195, 215: p+-type diffused region, 57-60, 77-80, 97-100, 117-120, 157-160, 177-180, 197-200, 217-220: p-type diffused region, 61, 81, 101, 121, 161, 181, 201, 221: valid layer, 82, 102, 182, 202, 222: collector wall, 301, 302: semiconductor device, 401: voltage generation circuit, 402: CPU, 501: power source, 502: processor, IS: constant current source, CR1-CR3: leakage current correction circuit, TDU: temperature detection unit, BUF1: buffer, CMPU1: comparison unit, TPS: power source input terminal, TOUT: output terminal, TC1, TC11, TC12: control terminal, MR1-MR5: current mirror circuit, VS: first reference voltage generation circuit, M1, M2, M16-M18, M24, M34, M35: NPN transistor, TD1-TD12: NPN transistor (temperature detection element), M4, M11, M21, M35: PNP transistor (reference-side transistor), M3, M12-M15, M22, M23, M31-M33: PNP transistor (output-side transistor), M6: NPN transistor (reference-side transistor), M5, M7: NPN transistor (output-side transistor), R1, R2: diffused resistor, R11-R13, R21-R23: resistor, VR1: variable resistor, AMP1, AMP2, AMP23: amplifier, CMP2, CMP11-CMP16: comparator, G1, G2: NOT gate, N1-N8: node, VTEMP: temperature detection node, VBG: reference voltage node, VDD: power source node, VSS: ground node.

BEST MODES FOR CARRYING OUT THE INVENTION

Embodiments of the present invention will hereinafter be described with reference to the drawings. Note that the same or corresponding portions in the drawings are provided with the same reference characters, and the description thereof will not be repeated.

First Embodiment

[Configuration and Basic Operation]

FIG. 1 is a diagram that shows a configuration of a semiconductor device according to a first embodiment of the present invention.

With reference to FIG. 1, a semiconductor device 301 includes a constant current source IS, leakage current correction circuits CR1-CR3, a temperature detection unit TDU, a buffer BUF1, a comparison unit CMPU1, a voltage selection circuit 11, a logic circuit 12, a first reference voltage generation circuit VS, a second reference voltage generation circuit 13, a power source input terminal TPS, output terminals TOUT1, TOUT2, a control terminal TC1, and a current mirror circuit MR5. Constant current source IS includes NPN transistors M1, M2, and a diffused resistor R1. First reference voltage generation circuit VS includes an NPN transistor M34, a diffused resistor R2, and a variable resistor VR1. Leakage current correction circuit CR1 includes current mirror circuits MR1, MR2, and a diffused resistor R3. Leakage current correction circuit CR2 includes a current mirror circuit MR3, and NPN transistors M16-M18. Leakage current correction circuit CR3 includes a current mirror circuit MR4 and an NPN transistor M24. Temperature detection unit TDU includes NPN transistors (temperature detection elements) TD1-TD12. Buffer BUF1 includes an amplifier AMP1. Comparison unit CMPU1 includes a comparator CMP2, NOT gates G1, G2, and an NPN transistor M35. Second reference voltage generation circuit 13 includes an amplifier AMP2, resistors R11-R13, and a variable resistor VR2.

Current mirror circuit MR1 includes a PNP transistor (reference-side transistor) M4, and a PNP transistor (output-side transistor) M3. Current mirror circuit MR2 includes an NPN transistor (reference-side transistor) M6, and NPN transistors (output-side transistors) M5, M7. Current mirror circuit MR3 includes a PNP transistor (reference-side transistor) M11, and PNP transistors (output-side transistors) M12-M15. Current mirror circuit MR4 includes a PNP transistor (reference-side transistor) M21, and PNP transistors (output-side transistors) M22, M23. Current mirror circuit MR5 includes a PNP transistor (reference-side transistor) M35, and PNP transistors (output-side transistors) M31-M33.

In current mirror circuit MR5, an emitter of each of PNP transistors M31-M33, M35 is connected to a power source node VDD to which a power source voltage VDD is supplied from an outside via a power source input terminal TPS. A base of each of PNP transistors M31-M33, M35 is connected to a node N6. A collector of PNP transistor M31 is connected to node N6. A collector of PNP transistor M32 is connected to a temperature detection node VTEMP. A collector of PNP transistor M33 is connected to a reference voltage node VBG. A collector of PNP transistor M35 is connected to a node N7.

In constant current source IS, an emitter of NPN transistor M1 is connected to a ground node VSS to which a ground voltage VSS is supplied. A base and a collector of NPN transistor M1, and a base of NPN transistor M2 are connected to node N7. A collector of NPN transistor M2 is connected to node N6. An emitter of NPN transistor M2 is connected to a first conductive electrode of diffused resistor R1 via a node N4. A second conductive electrode of diffused resistor R1 is connected to ground node VSS.

In temperature detection unit TDU, a base and a collector of each of NPN transistors TD1-TD3 are connected to temperature detection node VTEMP, and emitters of NPN transistors TD1-TD3 are connected to bases and collectors of NPN transistors TD4-TD6. Emitters of NPN transistors TD4-TD6 are connected to bases and collectors of NPN transistors TD7-TD9. Emitters of NPN transistors TD7-TD9 are connected to bases and collectors of NPN transistors TD10-TD12. An emitter of each of NPN transistors TD10-TD12 is connected to ground node VSS.

In leakage current correction circuit CR1, an emitter of PNP transistor M3 and an emitter of PNP transistor M4 are connected to power source node VDD. A base of PNP transistor M3, and a base and a collector of PNP transistor M4 are connected to a node N5. A collector of PNP transistor M3, a base of NPN transistor M5, a collector and a base of NPN transistor M6, a base of NPN transistor M7, and diffused resistor R3 are connected to one another via a node N1. An emitter of each of NPN transistors M5-M7 is connected to ground node VSS. A collector of NPN transistor M5 is connected to node N4. A collector of NPN transistor M7 is connected to a node N8.

In leakage current correction circuit CR2, an emitter of each of PNP transistors M11-M15 is connected to power source node VDD. A base of each of PNP transistors M11-M15 and a collector of PNP transistor M11 are connected to each other. The collector of PNP transistor M11 is connected to collectors and bases of NPN transistors M16-M18 via node N2. A collector of PNP transistor M15 is connected to bases and collectors of NPN transistors TD1-TD3 in temperature detection unit TDU. A collector of PNP transistor M14 is connected to bases and collectors of NPN transistors TD4-TD6 in temperature detection unit TDU. A collector of PNP transistor M13 is connected to bases and collectors of NPN transistors TD7-TD9 in temperature detection unit TDU. A collector of PNP transistor M12 is connected to bases and collectors of NPN transistors TD10-TD12 in temperature detection unit TDU.

In leakage current correction circuit CR3, an emitter of each of PNP transistors M21-M23 is connected to power source node VDD. A base and a collector of PNP transistor M21, and a base of each of PNP transistors M22, M23 are connected to a collector of NPN transistor M24 via a node N3. A collector of PNP transistor M22 is connected to node N7. A collector of PNP transistor M23 is connected to node N6. An emitter and a base of NPN transistor M24 are connected to each other.

In first reference voltage generation circuit VS, a base and a collector of NPN transistor M34 are connected to reference voltage node VBG. An emitter of NPN transistor M34 and a first conductive electrode of diffused resistor R2 are connected via node N8. A second conductive electrode of diffused resistor R2 and a first end of variable resistor VR1 are connected. A second end of variable resistor VR1 is connected to ground node VSS.

In second reference voltage generation circuit 13, amplifier AMP2 has an non-inverting input terminal connected to reference voltage node VBG, an inverting input terminal connected to a first end of resistor R12 and a first end of resistor R13, and an output terminal connected to a first end of resistor R11 and a second end of resistor R12. A second end of resistor R11 and a second end of resistor R13 are connected to ground node VSS.

Constant current source IS is a band-gap constant current source, for example, and generates a constant current IST. For example, the size of NPN transistor M2 is n-times as large as the size of NPN transistor M1 (n is a natural number greater than or equal to two).

Current mirror circuit MR5 supplies a current corresponding to constant current IST to temperature detection unit TDU, as a reference current IREF1. Further, current mirror circuit MR5 supplies a current corresponding to constant current IST to first reference voltage generation circuit VS, as a reference current IREF2.

Temperature detection unit TDU detects an ambient temperature, and in accordance with the detected temperature, changes a temperature detection voltage VTEMP and outputs the changed voltage to buffer BUF1.

More specifically, in temperature detection unit TDU, each of NPN transistors TD1-TD12 is diode-connected, and operates as a diode. In other words, a forward voltage of each of NPN transistors TD1-TD12 changes in accordance with an ambient temperature. Here, with the configuration in which a plurality of NPN transistors are connected in series between temperature detection node VTEMP and ground node VSS, it is possible to increase the changes in voltage of temperature detection node VTEMP with respect to temperature changes. Further, with the configuration in which a plurality of NPN transistors are connected in parallel between temperature detection node VTEMP and ground node VSS, it is possible to suppress variations in voltage of temperature detection node VTEMP with respect to a noise.

It is noted that temperature detection unit TDU is not limited to the configuration including a diode, and may have any configuration as long as it includes a temperature detection element, a voltage to be applied to opposite ends of the temperature detection element so as to allow a current greater than or equal to a prescribed value to flow through the opposite ends changing in accordance with an ambient temperature. Further, constant current source IS is not limited to a band-gap constant current source, and may be any circuit that applies a voltage to a temperature detection element so as to allow the current greater than or equal to the prescribed value to flow through the temperature detection element.

First reference voltage generation circuit VS, along with constant current source IS, configures a band gap constant voltage source, generates a reference voltage VBG based on a reference current IREF2 received from constant current source IS via current mirror circuit MR5, and outputs reference voltage VBG to second reference voltage generation circuit 13.

Second reference voltage generation circuit 13 amplifies reference voltage VBG received from first reference voltage generation circuit VS, divides the amplified voltage to generate a plurality of reference voltages, and outputs them to voltage selection circuit 11.

More specifically, amplifier AMP2 amplifies reference voltage VBG and outputs it. Four reference voltages at four nodes between the first end and the second end of resistor R11 are outputted to voltage selection circuit 11.

Logic circuit 12 generates a voltage selection control signal based on a control signal received from an outside via control terminal TC1, and outputs it to voltage selection circuit 11.

Voltage selection circuit 11 selects any one of the plurality of reference voltages received from second reference voltage generation circuit 13, based on the voltage selection control signal received from logic circuit 12, and outputs the selected one to comparison unit CMPU1, as a comparison voltage VCOMP.

Buffer BUF1 outputs temperature detection voltage VTEMP received from temperature detection unit TDU to comparison unit CMPU1 at low impedance, and also outputs temperature detection voltage VTEMP to an outside of semiconductor device 301 via output terminal TOUT1 at low impedance.

More specifically, amplifier AMP1 has a non-inverting input terminal that receives temperature detection voltage VTEMP, and an inverting input terminal and an output terminal that are connected to each other. In other words, amplifier AMP1 operates as a voltage follower circuit.

Comparison unit CMPU1 compares temperature detection voltage VTEMP received via buffer BUF1 with comparison voltage VCOMP received from voltage selection circuit 11, and outputs a signal indicating a comparison result to the outside of semiconductor device 301 via output terminal TOUT2.

More specifically, comparator CMP2 has an inverting input terminal that receives an output voltage of buffer BUF1, and a non-inverting input terminal that receives comparison voltage VCOMP. Comparator CMP2 outputs a signal at a logic low level when temperature detection voltage VTEMP is higher than comparison voltage VCOMP, and outputs a signal at a logic high level when temperature detection voltage VTEMP is lower than comparison voltage VCOMP. Comparator CMP2 has, for example, hysteresis.

NOT gate G1 inverts a logic level of the signal received from comparator CMP2, and outputs the inverted signal to NOT gate G2. NOT gate G2 inverts a logic level of the signal received from NOT gate G1, and outputs the inverted signal to a base of NPN transistor M35. NPN transistor M35 has a collector connected to an output terminal TOUT, and an emitter connected to ground node VSS.

On the outside of semiconductor device 301, output terminal TOUT2 is pulled up via a resistor REXT.

A leakage current correction circuit CR1 corrects variations in constant current IST, caused by a leakage current generated in diffused resistor R1. Further, leakage current correction circuit CR1 corrects variations in reference voltage VBG, caused by a leakage current generated in diffused resistor R2.

A leakage current correction circuit CR2 corrects variations in temperature detection voltage VTEMP, caused by a leakage current generated in NPN transistors TD1-TD12.

A leakage current correction circuit CR3 corrects variations in constant current IST, caused by a leakage current generated in NPN transistors M1, M2.

Figure 2:
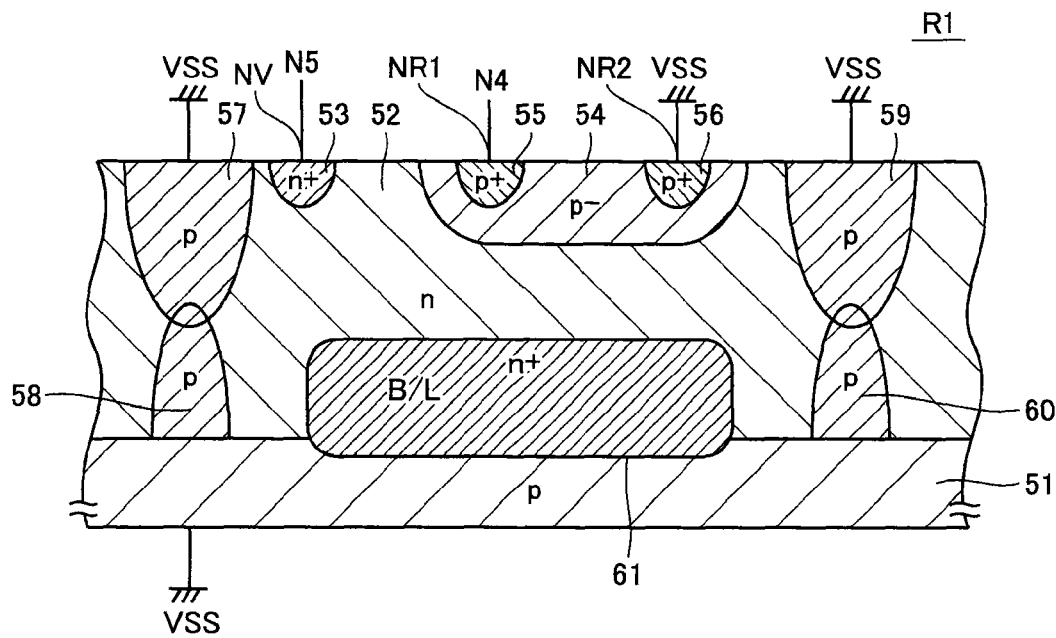
FIG. 2 is a cross-sectional view that shows a configuration of a diffused resistor R1.

FIG. 2 is a cross-sectional view that shows a configuration of diffused resistor R1.

With reference to FIG. 2, diffused resistor R1 includes a p-type substrate (semiconductor region) 51, an n-type diffused region 52, an n+-type diffused region 53, a p--type diffused region 54, p+-type diffused regions 55, 56, and p-type diffused regions 57-60.

A valid layer 61 is an n+-type semiconductor region, and is formed to decrease an electrical resistance value in p-type substrate 51 and n-type diffused region 52.

P-type substrate 51 is connected to ground node VSS. N-type diffused region 52 is formed on a main surface of p-type substrate 51.

N+-type diffused region 53 is formed to be spaced apart from the main surface of p-type substrate 51, at a surface of n-type diffused region 52. N+-type diffused region 53 has a potential-fixing node NV for fixing a potential. N+-type diffused region 53 is connected to reference-side transistor M4 in mirror circuit MR1 via node N5.

P--type diffused region 54 is formed to be spaced apart from the main surface of p-type substrate 51 and n+-type diffused region 53, at a surface of n-type diffused region 52. P+-type diffused region 55 is formed to be spaced apart from n-type diffused region 52 and p+-type diffused region 56, at a surface of p--type diffused region 54. P+-type diffused region 55 has a resistor node NR1 connected to an output-side transistor M5 in mirror circuit MR2 via node N4. P+-type diffused region 56 is formed to be spaced apart from n-type diffused region 52 and p+-type diffused region 55, at a surface of p--type diffused region 54. P+-type diffused region 56 has a resistor node NR2 connected to ground node VSS.

P-type diffused regions 57-60 are formed to surround n-type diffused region 52 with the help of p-type substrate 51.

Here, in diffused resistor R1, a leakage current IR1 flows between power source node VDD and ground node VSS via potential-fixing node NV and resistor node NR2. Leakage current IR1 has temperature characteristics, and thus constant current IST becomes no longer constant with respect to temperature changes.

With reference to FIG. 1 again, in the semiconductor device according to the first embodiment of the present invention, leakage current correction circuit CR1 allows a current having approximately the same magnitude and the same direction as those of leakage current IR1 to flow between power source node VDD and ground node VSS, not via diffused resistor R1 but via NPN transistor M2.

More specifically, an output-side transistor M3 in mirror circuit MR1 outputs a current corresponding to leakage current IR1 flowing through reference-side transistor M4. Output-side transistor M5 in mirror circuit MR2 then allows a current corresponding to a current flowing through reference-side transistor M6, namely, an output current of mirror circuit MR1, to flow between an emitter of NPN transistor M2 and ground node VSS, not via diffused resistor R1.

With such a configuration, it is possible to correct an error in constant current IST caused by leakage current IR1, and accordingly suppress degradation in temperature detection accuracy caused by a leakage current.

Figure 3:
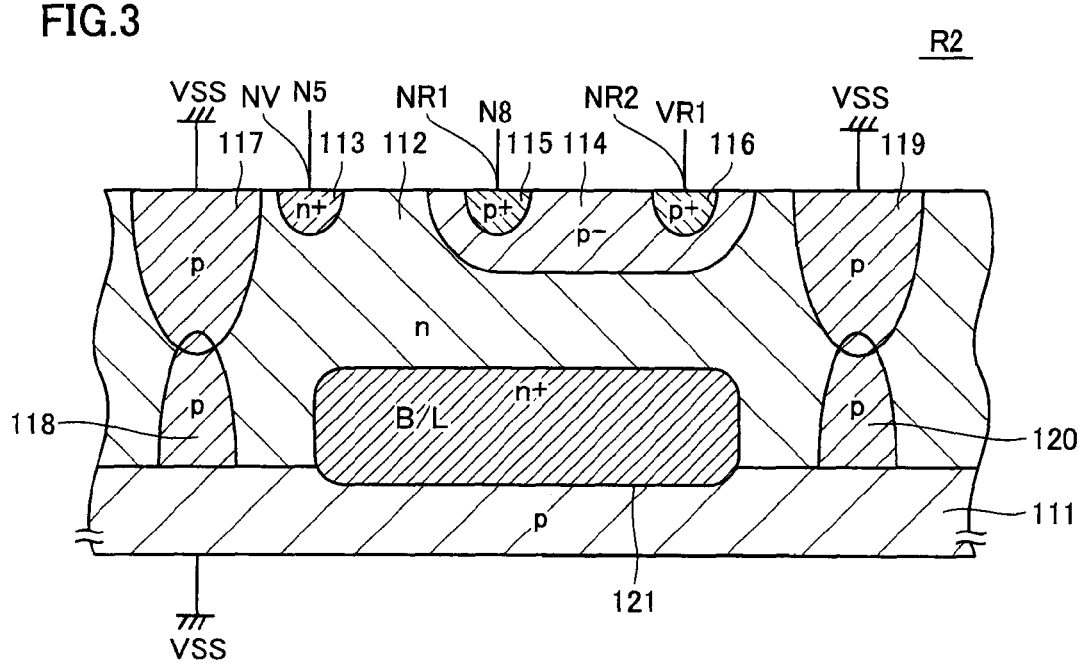
FIG. 3 is a cross-sectional view that shows a configuration of a diffused resistor R2.

FIG. 3 is a cross-sectional view that shows a configuration of diffused resistor R2.

With reference to FIG. 3, diffused resistor R2 includes a p-type substrate (semiconductor region) 111, an n-type diffused region 112, an n+-type diffused region 113, a p--type diffused region 114, p+-type diffused regions 115, 116, and p-type diffused regions 117-120.

A valid layer 121 is an n+-type semiconductor region, and is formed to decrease an electrical resistance value in p-type substrate 111 and n-type diffused region 112.

P-type substrate 111 is connected to ground node VSS. N-type diffused region 112 is formed on a main surface of p-type substrate 111.

N+-type diffused region 113 is formed to be spaced apart from the main surface of p-type substrate 111, at a surface of n-type diffused region 112. N+-type diffused region 113 has potential-fixing node NV for fixing a potential. N+-type diffused region 113 is connected to reference-side transistor M4 in mirror circuit MR1 via node N5.

P--type diffused region 114 is formed to be spaced apart from the main surface of p-type substrate 111 and n+-type diffused region 113, at a surface of n-type diffused region 112. P+-type diffused region 115 is formed to be spaced apart from n-type diffused region 112 and p+-type diffused region 116, at a surface of p--type diffused region 114. P+-type diffused region 115 has resistor node NR1 connected to an output-side transistor M7 in mirror circuit MR2 via node N8. P+-type diffused region 116 is formed to be spaced apart from n-type diffused region 112 and p+-type diffused region 115, at a surface of p--type diffused region 114, P+-type diffused region 116 has resistor node NR2 connected to variable resistor VR1.

P-type diffused regions 117-120 are formed to surround n-type diffused region 112 with the help of p-type substrate 111.

Here, in diffused resistor R2, a leakage current IR2 flows between power source node VDD and ground node VSS via potential-fixing node NV and resistor node NR2. Leakage current IR2 has temperature characteristics, and thus reference voltage VBG becomes no longer constant with respect to temperature changes.

With reference to FIG. 1 again, in the semiconductor device according to the first embodiment of the present invention, leakage current correction circuit CR1 allows a current having approximately the same magnitude and the same direction as those of leakage current IR2 to flow between power source node VDD and ground node VSS, not via diffused resistor R2 but via node N8.

More specifically, output-side transistor M3 in mirror circuit MR1 outputs a current corresponding to leakage current IR2 flowing through reference-side transistor M4. Output-side transistor M7 in mirror circuit MR2 then allows a current corresponding to a current flowing through reference-side transistor M6, namely, an output current of mirror circuit MR1, to flow between node N8 and ground node VSS, not via resistor node NR2 of diffused resistor R2.

With such a configuration, it is possible to correct an error in reference voltage VBG caused by leakage current IR2, and hence suppress degradation in temperature detection accuracy caused by a leakage current.

Further, in diffused resistor R1, a leakage current IR3 flows between potential-fixing node NV and ground node VSS via a diode XD1 formed of n-type diffused region 52, and p-type diffused regions 57-60 and p-type substrate 51. Further, in diffused resistor R2, a leakage current IR4 flows between power source node VDD and ground node VSS via a diode XD8 formed of n-type diffused region 112, and p-type diffused regions 117-120 and p-type substrate 111.

As a result, leakage currents IR3 and IR4 also flow through reference-side transistor M4 in mirror circuit MR1, resulting in that output-side transistor M3 in mirror circuit MR2 also outputs a current corresponding to leakage currents IR3 and IR4. Consequently, leakage current correction circuit CR1 can no longer accurately correct an error in constant current IST caused by leakage current IR1, and an error in reference voltage VBG caused by leakage current IR2.

Therefore, in the semiconductor device according to the first embodiment of the present invention, diffused resistor R3 is provided as a dummy diffused resistor.

Figure 4:
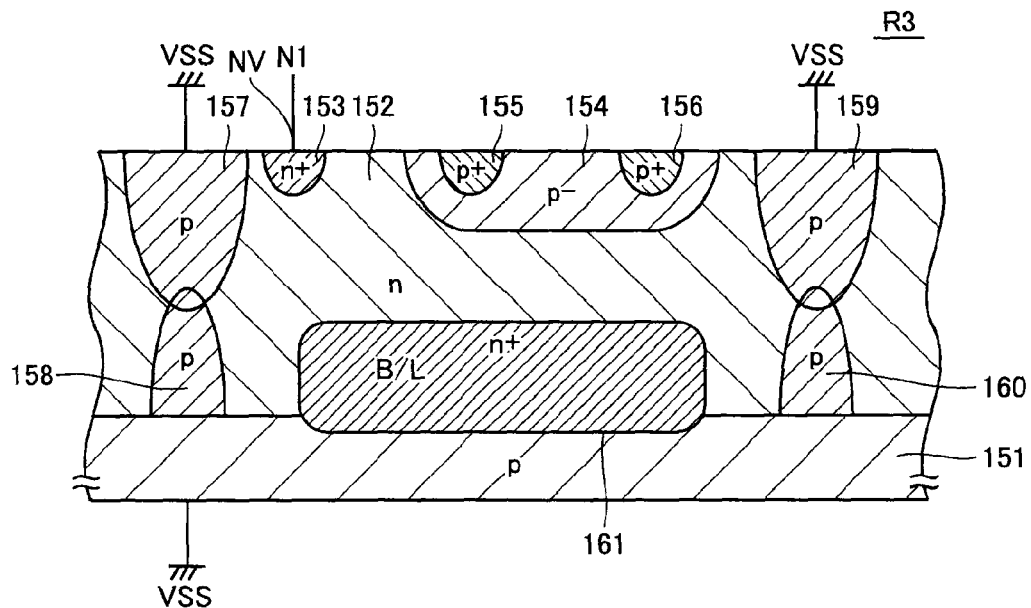
FIG. 4 is a cross-sectional view that shows a configuration of a diffused resistor R3.

FIG. 4 is a cross-sectional view that shows a configuration of diffused resistor R3.

With reference to FIG. 4, diffused resistor R3 includes a p-type substrate (semiconductor region) 151, an n-type diffused region 152, an n+-type diffused region 153, a p--type diffused region 154, p+-type diffused regions 155, 156, and p-type diffused regions 157-160.

A valid layer 161 is an n+-type semiconductor region, and formed to decrease an electrical resistance value in p-type substrate 151 and n-type diffused region 152.

P-type substrate 151 is connected to ground node VSS. N-type diffused region 152 is formed on a main surface of p-type substrate 151.

N+-type diffused region 153 is formed to be spaced apart from the main surface of p-type substrate 151, at a surface of n-type diffused region 152. N+-type diffused region 153 has potential-fixing node NV for fixing a potential. N+-type diffused region 153 is connected to node N1.

P--type diffused region 154 is formed to be spaced apart from the main surface of p-type substrate 151 and n+-type diffused region 153, at a surface of n-type diffused region 152. P+-type diffused region 155 is formed to be spaced apart from n-type diffused region 152 and p+-type diffused region 156, at the surface of p--type diffused region 154. P+-type diffused region 156 is formed to be spaced apart from n-type diffused region 152 and p+-type diffused region 155, at the surface of p--type diffused region 154. P+-type diffused regions 155, 156 are open-circuited.

P-type diffused regions 157-160 are formed to surround n-type diffused region 152 with the help of p-type substrate 151.

Here, in diffused resistor R3, a leakage current IR5 flows between n+-type diffused region 153 and ground node VSS via a diode XD2 formed of n-type diffused region 152, and p-type diffused regions 157-160 and p-type substrate 151, similarly as in the case of diffused resistors R1, R2.

As described above, a composite current made of leakage currents IR1-IR4 flows through reference-side transistor M4 in mirror circuit MR1. Output-side transistor M3 in mirror circuit MR1 outputs a current corresponding to the composite current.

Here, leakage current IR5 flows from output-side transistor M3 to diffused resistor R3, so that a current obtained by subtracting leakage current IR5 from an output current of output-side transistor M3 flows through reference-side transistor M6 in mirror circuit MR2. Consequently, output-side transistor M5 in mirror circuit MR2 allows a current only corresponding to leakage current IR1, among the output current of mirror circuit MR1, to flow between an emitter of NPN transistor M2 and ground node VSS, not via diffused resistor R1. Further, output-side transistor M7 in mirror circuit MR2 allows a current only corresponding to leakage current IR2, among the output current of mirror circuit MR1, to flow between node N8 and ground node VSS, not via diffused resistor R2.

A current value of leakage current IR3 is determined by a contact area S1 of p-type diffused regions 57-60 and p-type substrate 51 and n-type diffused region 52 in diffused resistor R1. Further, a current value of leakage current IR4 is determined by a contact area S2 of p-type diffused regions 117-120 and p-type substrate 111, and n-type diffused region 112 in diffused resistor R2. Further, a current value of leakage current IR5 is determined by a contact area S3 of p-type diffused regions 157-160 and p-type substrate 151, and n-type diffused region 152 in dummy diffused resistor R3.

In the semiconductor device according to the first embodiment of the present invention, a value obtained by multiplying contact area S1 by a mirror ratio of current mirror circuit MR1 is approximately equal to contact area S3. Leakage current correction circuit CR1 can thereby allow a current having approximately the same magnitude and the same direction as those of leakage current IR1 to flow between power source node VDD and ground node VSS, not via diffused resistor R1 but via NPN transistor M2.

Further, a value obtained by multiplying contact area S2 by a mirror ratio of current mirror circuit MR1 is approximately equal to contact area S3. Leakage current correction circuit CR1 can thereby allow a current having approximately the same magnitude and the same direction as those of leakage current IR2 to flow between power source node VDD and ground node VSS, not via diffused resistor R2 but via node N8.

With such a configuration, it is possible to prevent leakage current IR3 from hindering accurate correction to an error in constant current IST. Furthermore, it is possible to prevent leakage current IR4 from hindering accurate correction to an error in reference voltage VBG. Accordingly, it is possible to further suppress degradation in temperature detection accuracy caused by a leakage current.

Figure 5:
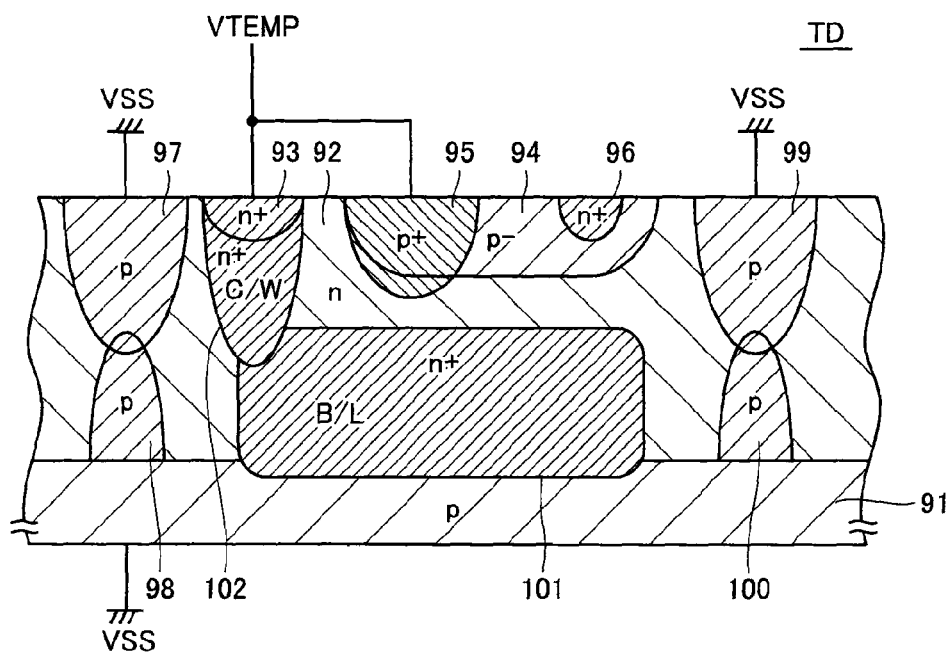
FIG. 5 is a cross-sectional view that shows a configuration of an NPN transistor TD.

FIG. 5 is a cross-sectional view that shows a configuration of NPN transistor TD. Here, NPN transistor TD corresponds to each of NPN transistors TD1-TD12.

With reference to FIG. 5, NPN transistor TD includes a p-type substrate (semiconductor region) 91, an n-type diffused region 92, n+-type diffused regions 93, 96, a p--type diffused region 94, a p+-type diffused region 95, and p-type diffused regions 97-100.

A valid layer 101 is an n+-type semiconductor region, and formed to decrease an electrical resistance value in p-type substrate 91 and n-type diffused region 92. A collector wall 102 is an n+-type semiconductor region, and formed to decrease an electrical resistance value in n-type diffused region 92.

P-type substrate 91 is connected to ground node VSS. N-type diffused region 92 is formed on a main surface of p-type substrate 91.

N+-type diffused region 93 is formed to be spaced apart from the main surface of p-type substrate 91, at a surface of n-type diffused region 92. N+-type diffused region 93 is connected to temperature detection node VTEMP directly or via another NPN transistor TD.

P--type diffused region 94 is formed to be spaced apart from the main surface of p-type substrate 91 and n+-type diffused region 93, at a surface of n-type diffused region 92. P+-type diffused region 95 is formed to be spaced apart from the main surface of p-type substrate 91 and n+-type diffused regions 93, 96, at the surface of n-type diffused region 92. P+-type diffused region 95 is connected to temperature detection node VTEMP directly or via another NPN transistor TD. N+-type diffused region 96 is formed to be spaced apart from n-type diffused region 92 and p+-type diffused region 95, at the surface of p--type diffused region 94. P+-type diffused region 96 is coupled to ground node VSS directly or via another NPN transistor TD.

P-type diffused regions 97-100 are formed to surround n-type diffused region 92 with the help of p-type substrate 91.

Here, in NPN transistors TD1-TD12, a leakage current IR6 flows between power source node VDD and ground node VSS via diodes XD3-XD6 formed of n-type diffused region 92, and p-type diffused regions 97-100 and p-type substrate 91. Leakage current IR6 has temperature characteristics, and thus an amount of change in temperature detection voltage VTEMP with respect to temperature changes becomes no longer constant.

Therefore, in the semiconductor device according to the first embodiment of the present invention, NPN transistors M16-M18 are provided as a dummy transistor TDD.

Figure 6:
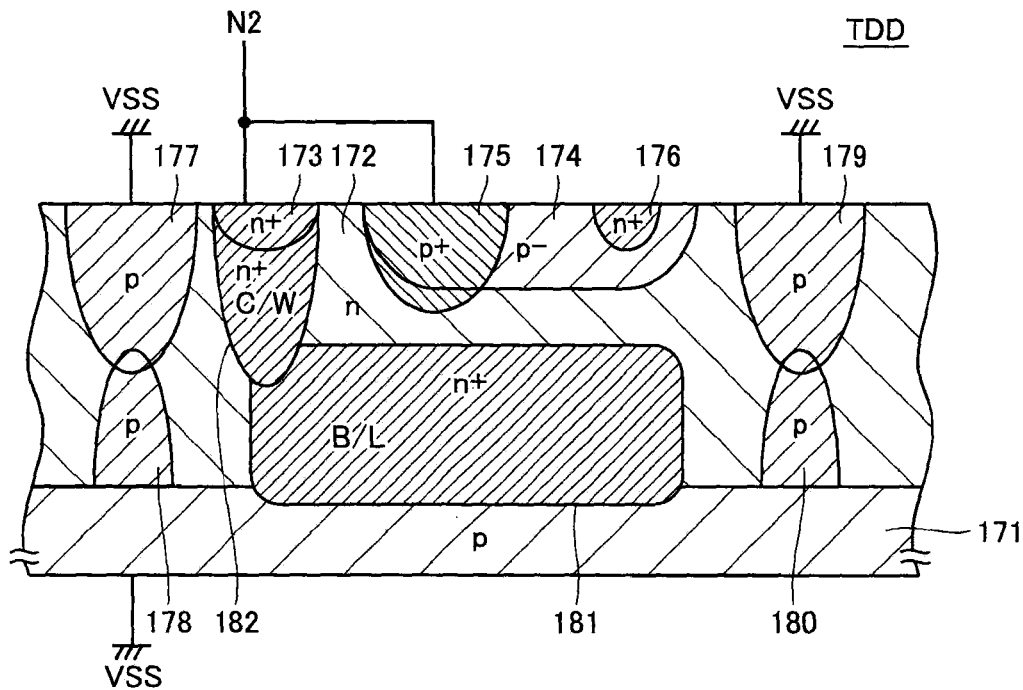
FIG. 6 is a cross-sectional view that shows a configuration of a dummy transistor.

FIG. 6 is a cross-sectional view that shows a configuration of the dummy transistor.

With reference to FIG. 6, dummy transistor TDD includes a p-type substrate (semiconductor region) 171, an n-type diffused region 172, n+-type diffused regions 173, 176, a p--type diffused region 174, a p+-type diffused region 175, and p-type diffused regions 177-180.

A valid layer 181 is an n+-type semiconductor region, and formed to decrease an electrical resistance value in p-type substrate 171 and n-type diffused region 172. A collector wall 182 is an n+-type semiconductor region, and formed to decrease an electrical resistance value in n-type diffused region 172.

A p-type substrate 171 is connected to ground node VSS. N-type diffused region 172 is formed on a main surface of p-type substrate 171.

N+-type diffused region 173 is formed to be spaced apart from the main surface of p-type substrate 171, at a surface of n-type diffused region 172. N+-type diffused region 173 is connected to current mirror circuit MR3 via node N2.

P--type diffused region 174 is formed to be spaced apart from the main surface of p-type substrate 171 and n+-type diffused region 173, at the surface of n-type diffused region 172. P+-type diffused region 175 is formed to be spaced apart from the main surface of p-type substrate 171 and n+-type diffused regions 173, 176, at the surface of n-type diffused region 172. P+-type diffused region 175 is connected to current mirror circuit MR3 via node N2. N+-type diffused region 176 is formed to be spaced apart from n-type diffused region 172 and p+-type diffused region 175, at the surface of p--type diffused region 174. P+-type diffused region 176 is open-circuited.

P-type diffused regions 177-180 are formed to surround n-type diffused region 172 with the help of p-type substrate 171.

Here, in dummy transistor TDD, a leakage current IR7 flows between power source node VDD and ground node VSS via a diode XD7 formed of n-type diffused region 172, and p-type diffused regions 177-180 and p-type substrate 171, similarly as in the case of NPN transistor TD.

Output-side transistors M12-M15 in mirror circuit MR3 output a current corresponding to leakage current IR7, which flows through reference-side transistor M11, to NPN transistors TD1-TD3, NPN transistors TD4-TD6, NPN transistors TD7-TD9, and NPN transistors TD10-TD12, respectively.

A current value of leakage current IR6 is determined by a contact area S4 of p-type diffused regions 97-100 and p-type substrate 91, and n-type diffused region 92 in NPN transistor TD. Further, a current value of leakage current IR7 is determined by a contact area S5 of p-type diffused regions 177-180 and p-type substrate 171, and n-type diffused region 172 in dummy transistor TDD.

In the semiconductor device according to the first embodiment of the present invention, a value obtained by multiplying contact area S5 by a mirror ratio of mirror circuit MR3 is approximately equal to contact area S4. Leakage current correction circuit CR2 can thereby allow a current having approximately the same magnitude and the same direction as those of leakage current IR6 to flow between power source node VDD and ground node VSS via p+-type diffused region 95, p--type diffused region 94, and n+-type diffused region 96 in NPN transistor TD.

With such a configuration, it is possible to correct a deviation from the linearity of temperature detection voltage TEMP exhibited with respect to temperature changes, and hence suppress degradation in temperature detection accuracy caused by a leakage current.

Figure 7:
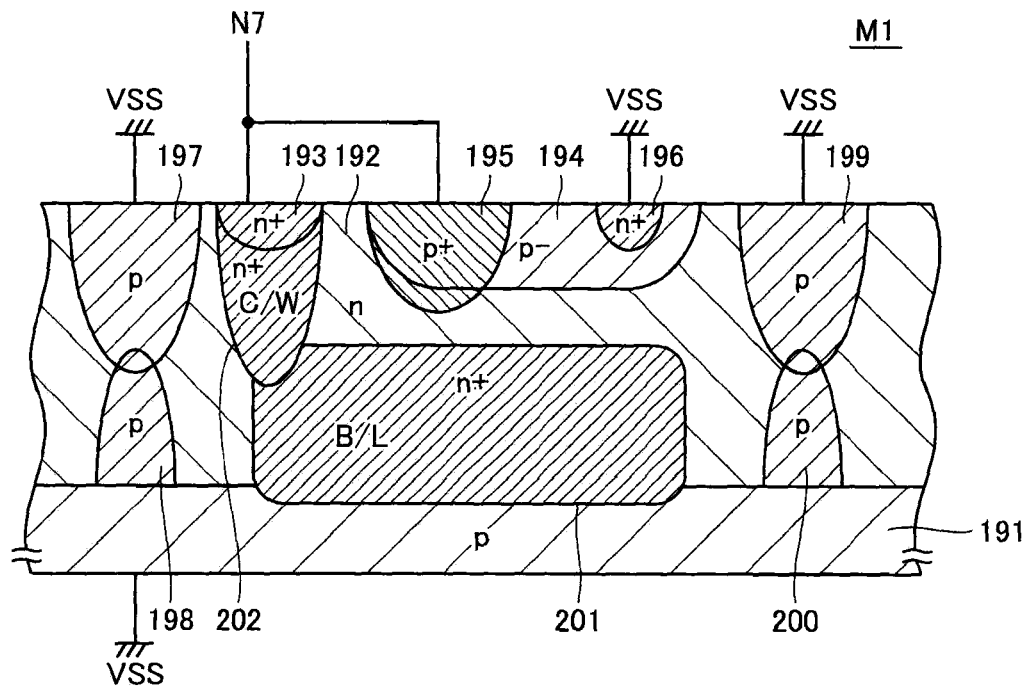
FIG. 7 is a cross-sectional view that shows a configuration of an NPN transistor M1.

FIG. 7 is a cross-sectional view that shows a configuration of NPN transistor M1.

With reference to FIG. 7, NPN transistor M1 includes a p-type substrate (semiconductor region) 191, an n-type diffused region 192, n+-type diffused regions 193, 196, a p−-type diffused region 194, a p+-type diffused region 195, and p-type diffused regions 197-200.

A valid layer 201 is formed to decrease an electrical resistance value in p-type substrate 191 and n-type diffused region 192. A collector wall 202 is an n+-type semiconductor region, and formed to decrease an electrical resistance value in n-type diffused region 192.

P-type substrate 191 is connected to ground node VSS. N-type diffused region 192 is formed on a main surface of p-type substrate 191.

N+-type diffused region 193 is formed to be spaced apart from the main surface of p-type substrate 191, at a surface of n-type diffused region 192. N+-type diffused region 193 is connected to current mirror circuit MR4 via node N7.

P−-type diffused region 194 is formed to be spaced apart from the main surface of p-type substrate 191 and n+-type diffused region 193, at the surface of n-type diffused region 192. P+-type diffused region 195 is formed to be spaced apart from the main surface of p-type substrate 191 and n+-type diffused regions 193, 196, at the surface of n-type diffused region 192. P+-type diffused region 195 is connected to current mirror circuit MR4 via node N7. N+-type diffused region 196 is formed to be spaced apart from n-type diffused region 192 and p+-type diffused region 195, at a surface of p−-type diffused region 194. P+-type diffused region 196 is coupled to ground node VSS.

P-type diffused regions 197-200 are formed to surround n-type diffused region 192 with the help of p-type substrate 191.

Here, in NPN transistor M1, a leakage current IR8 flows between power source node VDD and ground node VSS via a diode XD8 formed of n-type diffused region 192, and p-type diffused regions 197-200 and p-type substrate 191. Leakage current IR8 has temperature characteristics, and thus constant current IST becomes no longer constant with respect to temperature changes.

Figure 8:
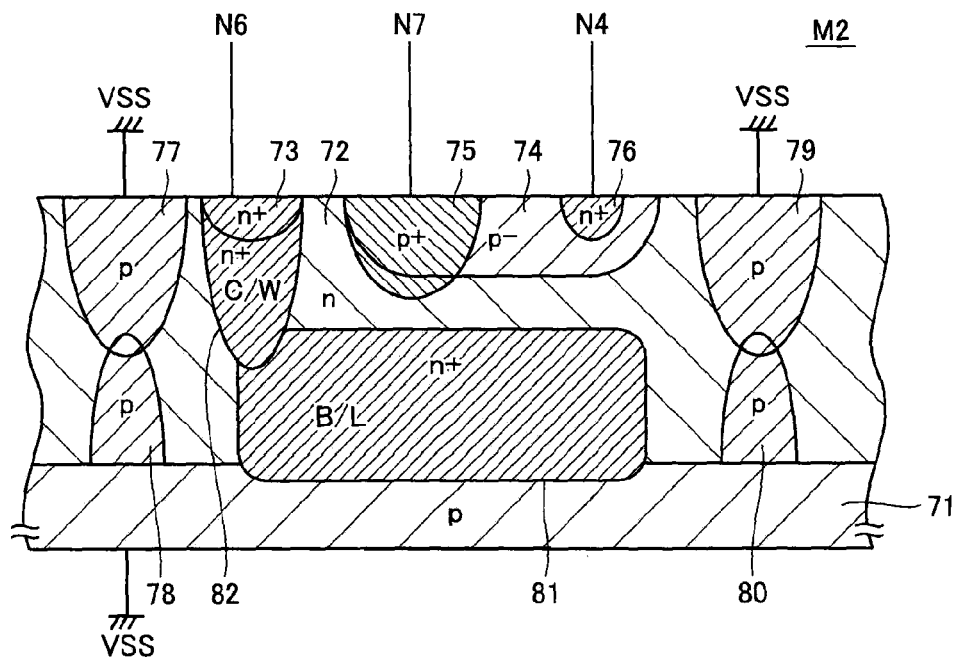
FIG. 8 is a cross-sectional view that shows a configuration of an NPN transistor M2.

FIG. 8 is a cross-sectional view that shows a configuration of NPN transistor M2.

With reference to FIG. 8, NPN transistor M2 includes a p-type substrate (semiconductor region) 71, an n-type diffused region 72, n+-type diffused regions 73, 76, a p−-type diffused region 74, a p+-type diffused region 75, and p-type diffused regions 77-80.

A valid layer 81 is an n+-type semiconductor region, and formed to decrease an electrical resistance value in p-type substrate 71 and n-type diffused region 72. A collector wall 82 is an n+-type semiconductor region, and formed to decrease an electrical resistance value in n-type diffused region 72.

P-type substrate 71 is connected to ground node VSS. N-type diffused region 72 is formed on a main surface of p-type substrate 71.

N+-type diffused region 73 is formed to be spaced apart from the main surface of p-type substrate 71, at a surface of n-type diffused region 72. N+-type diffused region 73 is connected to current mirror circuit MR4 via node N6.

P−-type diffused region 74 is formed to be spaced apart from the main surface of p-type substrate 71 and n+-type diffused region 73, at a surface of n-type diffused region 72. P+-type diffused region 75 is formed to be spaced apart from the main surface of p-type substrate 71 and n+-type diffused regions 73, 76, at the surface of n-type diffused region 72. P+-type diffused region 75 is connected to current mirror circuit MR4 via node N7. N+-type diffused region 76 is formed to be spaced apart from n-type diffused region 72 and p+-type diffused region 75, at the surface of p−-type diffused region 74. P+-type diffused region 76 is connected to diffused resistor R1 via node N4.

P-type diffused regions 77-80 are formed to surround n-type diffused region 72 with the help of p-type substrate 71.

Here, in NPN transistor M2, a leakage current IR9 flows between power source node VDD and ground node VSS via a diode XD9 formed of n-type diffused region 72, and p-type diffused regions 77-80 and p-type substrate 71. Leakage current IR9 has temperature characteristics, and thus constant current IST becomes no longer constant with respect to temperature changes.

Therefore, in the semiconductor device according to the first embodiment of the present invention, an NPN transistor M24 is provided.

Figure 9:
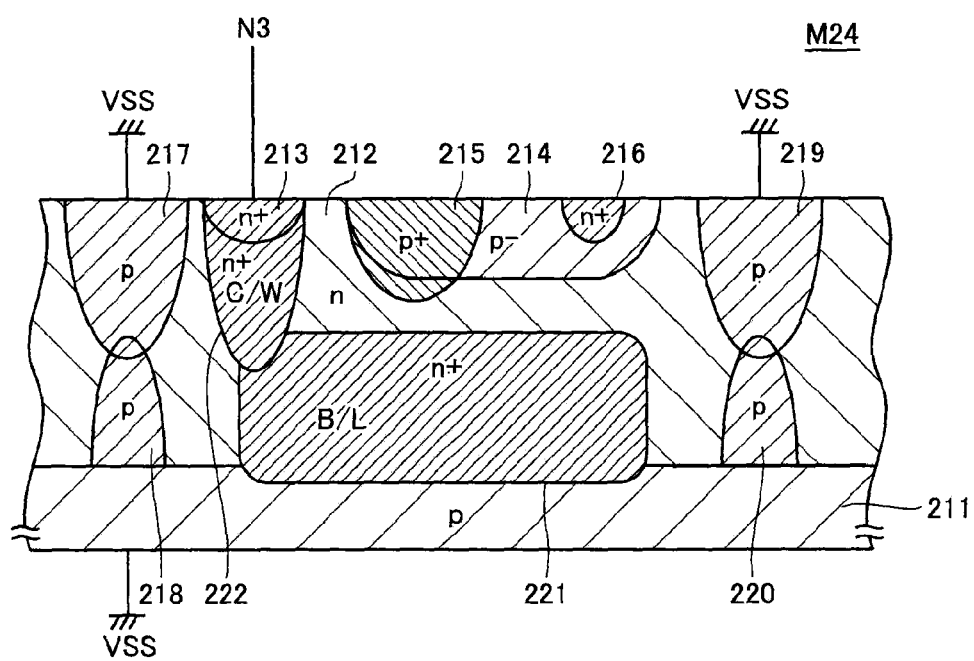
FIG. 9 is a cross-sectional view that shows a configuration of an NPN transistor M24.

FIG. 9 is a cross-sectional view that shows a configuration of NPN transistor M24.

With reference to FIG. 9, NPN transistor M24 includes a p-type substrate (semiconductor region) 211, an n-type diffused region 212, n+-type diffused regions 213, 216, a p−-type diffused region 214, a p+-type diffused region 215, and p-type diffused regions 217-220.

A valid layer 221 is an n+-type semiconductor region, and formed to decrease an electrical resistance value in p-type substrate 211 and n-type diffused region 212. A collector wall 222 is an n+-type semiconductor region, and formed to decrease an electrical resistance value in n-type diffused region 212.

P-type substrate 211 is connected to ground node VSS. N-type diffused region 212 is formed on a main surface of p-type substrate 211.

N+-type diffused region 213 is formed to be spaced apart from the main surface of p-type substrate 211, at a surface of n-type diffused region 212. N+-type diffused region 213 is connected to current mirror circuit MR4 via node N3.

P−-type diffused region 214 is formed to be spaced apart from the main surface of p-type substrate 211 and n+-type diffused region 213, at the surface of n-type diffused region 212. P+-type diffused region 215 is formed to be spaced apart from the main surface of p-type substrate 211 and n+-type diffused regions 213, 216, at the surface of n-type diffused region 212. N+-type diffused region 216 is formed to be spaced apart from n-type diffused region 212 and p+-type diffused region 215, at a surface of p−-type diffused region 214. P+-type diffused regions 215, 216 are open-circuited.

P-type diffused regions 217-220 are formed to surround n-type diffused region 212 with the help of p-type substrate 211.

Here, in NPN transistor M24, a leakage current IR10 flows between power source node VDD and ground node VSS via a diode XD10 formed of n-type diffused region 212, and p-type diffused regions 217-220 and p-type substrate 211, similarly as in the case of NPN transistors M1, M2.

Leakage current IR10 flows through reference-side transistor M21 in mirror circuit MR4. An output-side transistor M22 in mirror circuit MR4 allows a current corresponding to leakage current IR10 to flow between power source node VDD and ground node VSS via NPN transistor M1. Further, output-side transistor M23 in mirror circuit MR4 allows a current corresponding to leakage current IR10 to flow between power source node VDD and ground node VSS via NPN transistor M2.

A current value of leakage current IR8 is determined by a contact area S6 of p-type diffused regions 197-200 and p-type substrate 191, and n-type diffused region 192 in NPN transistor M1. Further, a current value of leakage current IR9 is determined by a contact area S7 of p-type diffused regions 77-80 and p-type substrate 71, and n-type diffused region 72 in NPN transistor M2. Further, a current value of leakage current IR10 is determined by a contact area S8 of p-type diffused regions 217-100 and p-type substrate 211, and n-type diffused region 212 in NPN transistor M24.

In the semiconductor device according to the first embodiment of the present invention, a value obtained by multiplying contact area S8 by a mirror ratio of the mirror circuit configured with reference-side transistor M21 and output-side transistor M22 is approximately equal to contact area S6. Leakage current correction circuit CR3 can thereby allow a current having approximately the same magnitude and the same direction as those of leakage current IR8 to flow between power source node VDD and ground node VSS via n+-type diffused region 193, n-type diffused region 192, p+-type diffused region 195, p--type diffused region 194, and n+-type diffused region 196 in NPN transistor M1.

Further, a value obtained by multiplying contact area S8 by a mirror ratio of the mirror circuit configured with reference-side transistor M21 and output-side transistor M23 is approximately equal to contact area S7. Leakage current correction circuit CR3 can thereby allow a current having approximately the same magnitude and the same direction as those of leakage current IR9 to flow between power source node VDD and ground node VSS via n+-type diffused region 73, n-type diffused region 72, p+-type diffused region 75, p--type diffused region 74, and n+-type diffused region 76 in NPN transistor M2.

With such a configuration, it is possible to correct an error in constant current IST caused by leakage currents IR8, IR9, and hence suppress degradation in temperature detection accuracy caused by a leakage current.

Further, with the configuration that includes current mirror circuits MR1, MR2, as a current mirror circuit for correcting variations in constant current IST caused by a leakage current generated at diffused resistor R1, and a current mirror circuit for correcting variations in reference voltage VBG caused by a leakage current generated at diffused resistor R2, it is possible to downsize the semiconductor device. Note that it may also be possible to adopt a configuration in which semiconductor device 301 is separately provided with two current mirror circuits for correcting variations in constant current IST caused by a leakage current generated at diffused resistor R1, and two current mirror circuits for correcting variations in reference voltage VBG caused by a leakage current generated at diffused resistor R2.

Although the semiconductor device according to the first embodiment of the present invention is set to have a configuration that uses a bipolar transistor as the transistor, it is not limited thereto, and may also have a configuration that uses another type of transistor. For example, PNP transistor M4 and PNP transistor M3 in current mirror circuit MR1, NPN transistor M6 and NPN transistors M5, M7 in current mirror circuit MR2, PNP transistor M11 and PNP transistors M12-M15 in current mirror circuit MR3, PNP transistor M21 and PNP transistors M22, M23 in current mirror circuit MR4, and PNP transistor M35 and PNP transistors M31-M33 in current mirror circuit MR may be replaced with MOS (Metal Oxide Semiconductor) transistors. With such a configuration, it is possible to prevent a leakage current generated at a junction of the bipolar transistor, and thus configure a leakage current correction circuit having much superior characteristics. In the case that the MOS transistor is used for a current mirror circuit, no current flows from a gate of a reference-side transistor to a drain of an output-side transistor in the current mirror circuit, so that it is possible to configure a leakage current correction circuit having much superior characteristics.

In the temperature sensing circuit described in Patent Document 1, a leakage current is generated at a depletion-mode MOS transistor, a diode, and others. However, suppressing degradation in temperature detection accuracy caused by the leakage current is not considered. In contrast, in the semiconductor device according to the first embodiment of the present invention, leakage current correction circuit CR1 allows a current having approximately the same magnitude and the same direction as those of leakage current IR1 generated at diffused resistor R1 to flow between power source node VDD and ground node VSS, not via diffused resistor R1 but via NPN transistor M2. Further, leakage current correction circuit CR1 allows a current having approximately the same magnitude and the same direction as those of leakage current IR2 generated at diffused resistor R2 to flow between power source node VDD and ground node VSS, not via diffused resistor R2 but via node N8 between power source node VDD and diffused resistor R2.

With such a configuration, it is possible to correct variations in constant current IST and reference voltage VBG caused by a leakage current. Therefore, in the semiconductor device according to the first embodiment of the present invention, it is possible to accurately detect temperatures in a wide range by suppressing degradation in temperature detection accuracy caused by a leakage current.

Note that although the semiconductor device according to the first embodiment of the present invention is provided with comparison unit CMPU1, voltage selection circuit 11, logic circuit 12, second reference voltage generation circuit 13, and output terminal TOUT2, to thereby have a thermostat function, it is not limited thereto. Semiconductor device 301 may have a configuration that simply has a function of an analog temperature sensor, without including comparison unit CMPU1, voltage selection circuit 11, logic circuit 12, second reference voltage generation circuit 13, and output terminal TOUT2.

Next, an exemplary application of semiconductor device 301 will be described.

Figure 10:
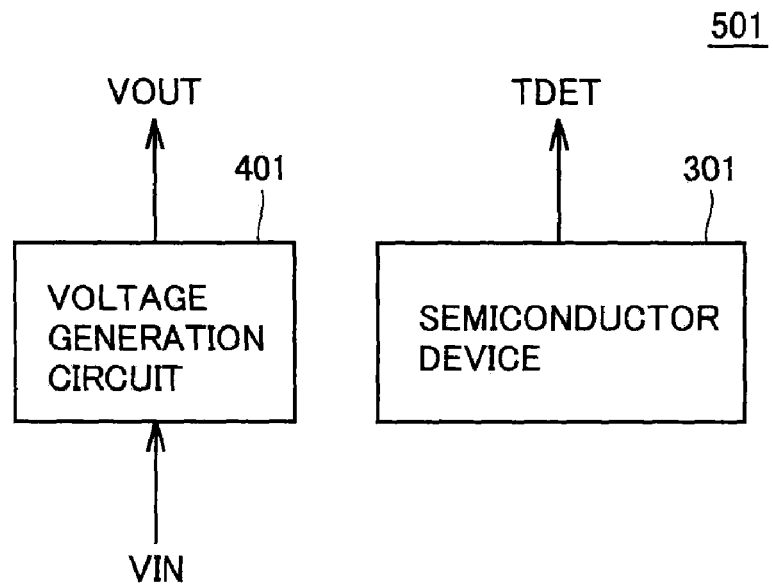
FIG. 10 is a diagram that shows a configuration of a power source according to the first embodiment of the present invention.

FIG. 10 is a diagram that shows a configuration of a power source according to the first embodiment of the present invention.

With reference to FIG. 10, a power source 501 includes a voltage generation circuit 401 and semiconductor device 301. Power source 501 is used as, for example, a power source for a computer.

Voltage generation circuit 401 generates a direct-current voltage VOUT having a prescribed voltage value, based on an alternately-current voltage VIN received from, for example, an outside.

Semiconductor device 301 is disposed in proximity to voltage generation circuit 401, and detects the temperature of voltage generation circuit 401, namely, detects a rise in ambient temperature caused by heat generated by voltage generation circuit 401. For example, semiconductor device 301 outputs a detection signal TDET at a logic high level when the ambient temperature is lower than a set temperature, and outputs detection signal TDET at a logic low level when the ambient temperature is higher than the set temperature.

Figure 11:
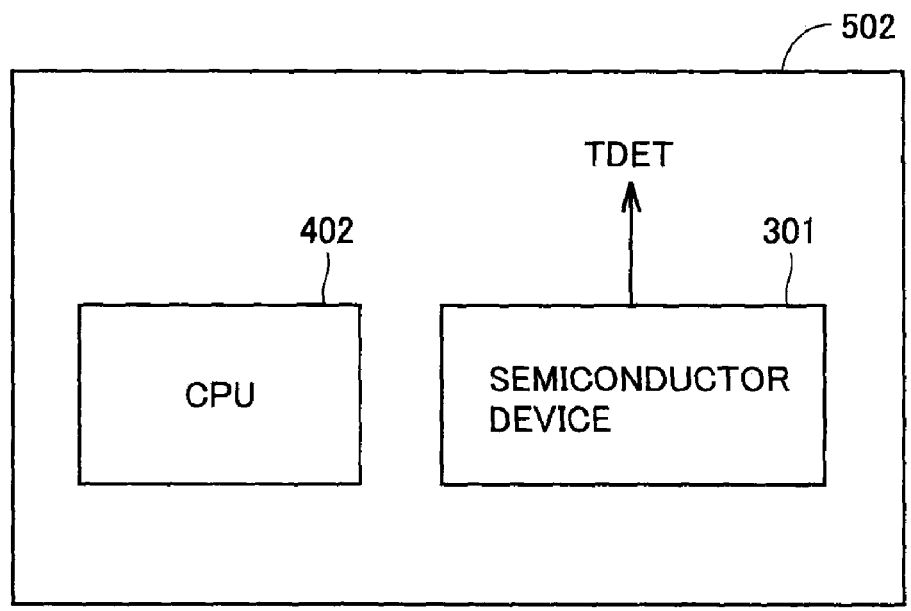
FIG. 11 is a diagram that shows a configuration of a processor according to the first embodiment of the present invention.

FIG. 11 is a diagram that shows a configuration of a processor according to the first embodiment of the present invention.

With reference to FIG. 11, a processor 502 includes a CPU (Central Processing Unit) 402 and semiconductor device 301. CPU 402 is a monolithic integrated circuit. Semiconductor device 301 is also a monolithic integrated circuit. Processor 502 is fabricated by packing CPU 402 and semiconductor device 301 in the same package.

CPU 402 conducts various arithmetic processing on the data received from an outside and the stored data, stores the results of the arithmetic processing, and outputs the results of the arithmetic processing to the outside.

Semiconductor device 301 is disposed in proximity to CPU 402, and detects the temperature of CPU 402, namely, detects a rise in ambient temperature caused by heat generated by CPU 402. For example, semiconductor device 301 outputs detection signal TDET at a logic high level when the ambient temperature is lower than a set temperature, and outputs detection signal TDET at a logic low level if the ambient temperature is higher than the set temperature.

Next, another embodiment of the present invention will be described with reference to the drawings. It is noted that the same or corresponding portions in the drawings are provided with the same reference characters and the description thereof will not be repeated.

Second Embodiment

The present embodiment relates to a semiconductor device in which a configuration that generates a control signal for selecting a reference voltage is modified with respect to that of the semiconductor device according to the first embodiment. The features other than those described below are the same as those of the semiconductor device according to the first embodiment.

Figure 12:
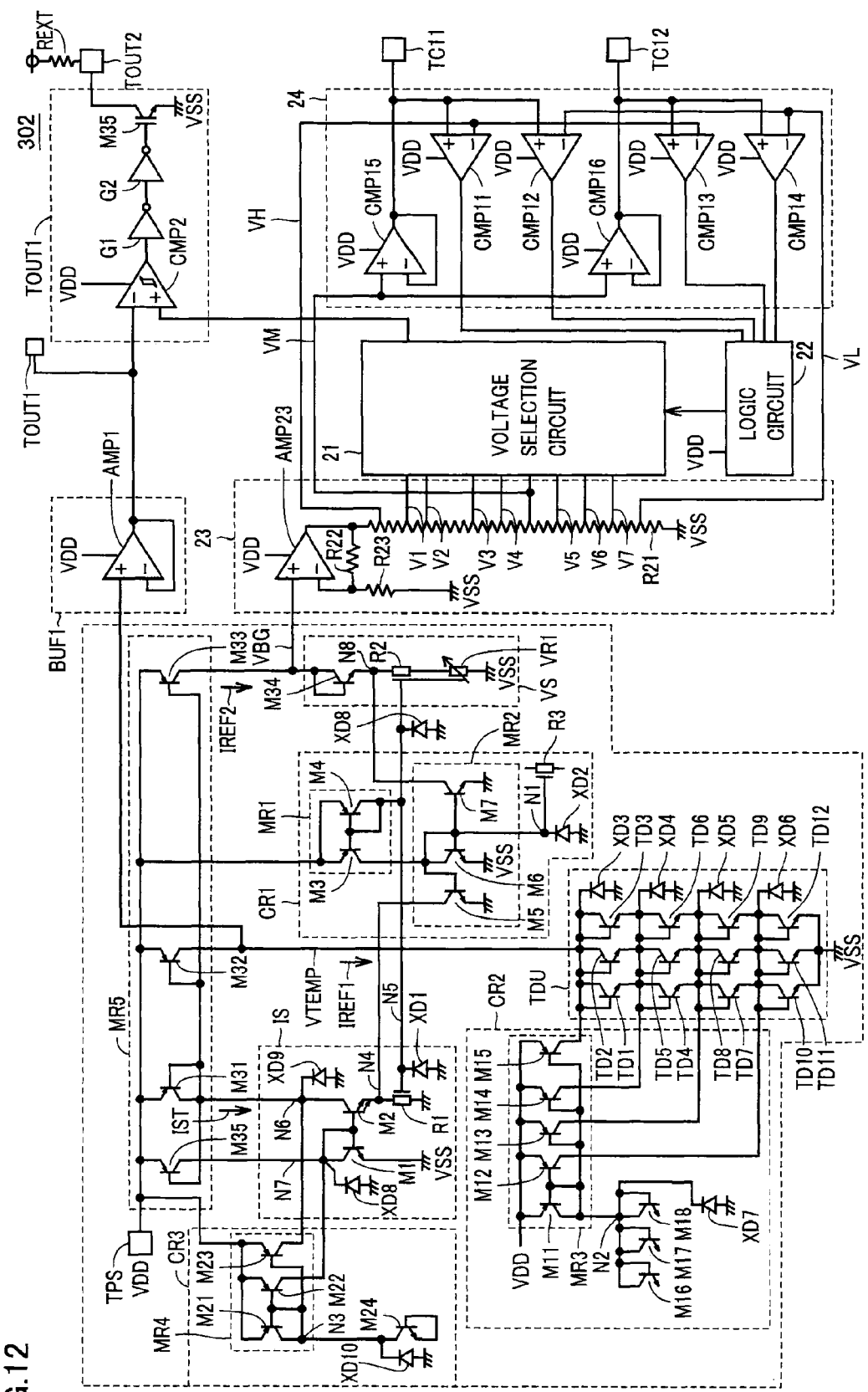
FIG. 12 is a diagram that shows a configuration of a semiconductor device according to a second embodiment of the present invention.

FIG. 12 is a diagram that shows a configuration of a semiconductor device according to a second embodiment of the present invention.

With reference to FIG. 12, a semiconductor device 302 includes constant current source IS, leakage current correction circuits CR1-CR3, temperature detection unit TDU, buffer BUF1, comparison unit CMPU1, a voltage selection circuit 21, a logic circuit 22, first reference voltage generation circuit VS, a second reference voltage generation circuit 23, a control signal generation unit 24, power source input terminal TPS, output terminals TOUT1, TOUT2, control terminals TC11, TC12, and current mirror circuit MR5.

Second reference voltage generation circuit 23 includes an amplifier AMP23 and resistors R21-R23. Control signal generation unit 24 includes comparators CMP 11-CMP16.

In second reference voltage generation circuit 23, amplifier AMP23 has a non-inverting input terminal connected to reference voltage node VBG, an inverting input terminal connected to a first end of a resistor R22 and a first end of a resistor R23, and an output terminal connected to a first end of a resistor R21 and a second end of a resistor R22. A second end of resistor R21 and a second end of resistor R23 are connected to ground node VSS.

Second reference voltage generation circuit 23 amplifies reference voltage VBG received from first reference voltage generation circuit VS, divides the amplified voltage to generate a plurality of reference voltages, and outputs the reference voltages to voltage selection circuit 21.

More specifically, amplifier AMP23 amplifies reference voltage VBG and outputs the amplified voltage VBG. Among reference voltages VH, V1, V2, V3, V4, VM, V5, V6, V7, VL at nine nodes between the first end and the second end of resistor R21, reference voltages V1, V2, V3, V4, VM, V5, V6, V7 are outputted to voltage selection circuit 21. Reference voltage VH, reference voltage VM, and reference voltage VL are outputted to control signal generation unit 24.

Control signal generation unit 24 outputs four control signals indicating potential states of control terminals TC11, TC22 to logic circuit 22.

Logic circuit 22 generates a voltage selection control signal based on the four control signals received from control signal generation unit 24, and outputs the generated signal to voltage selection circuit 21.

Based on the voltage selection control signal received from logic circuit 22, voltage selection circuit 21 selects any one of reference voltages V1, V2, V3, V4, VM, V5, V6, V7 received from second reference voltage generation circuit 23, and outputs the selected one to comparison unit CMPU1 as a comparison voltage VCOMP.

Comparator CMP15 has a non-inverting input terminal receiving a voltage VM, and an inverting input terminal and an output terminal connected to control terminal TC11. Comparator CMP15 operates as a voltage follower circuit.

Comparator CMP11 has an inverting input terminal receiving a voltage VH higher than voltage VM, and a non-inverting input terminal connected to an output terminal of comparator CMP15. Comparator CMP11 compares a voltage of the inverting input terminal and a voltage of the non-inverting input terminal, and outputs a control signal indicating a comparison result to logic circuit 22.

Comparator CMP12 has an inverting input terminal receiving a voltage VL lower than voltage VM, and a non-inverting input terminal connected to an output terminal of comparator CMP15. Comparator CMP12 compares a voltage of the inverting input terminal and a voltage of the non-inverting input terminal, and outputs a control signal indicating a comparison result to logic circuit 22.

Further, comparator CMP16 has a non-inverting input terminal receiving voltage VM, and an inverting input terminal and an output terminal connected to control terminal TC12. Comparator CMP16 operates as a voltage follower circuit.

Comparator CMP13 has an inverting input terminal receiving voltage VH higher than voltage VM, and a non-inverting input terminal connected to an output terminal of comparator CMP16. Comparator CMP13 compares a voltage of the inverting input terminal and a voltage of the non-inverting input terminal, and outputs a control signal indicating a comparison result to logic circuit 22.

Comparator CMP14 has an inverting input terminal receiving voltage VL lower than voltage VM, and a non-inverting input terminal connected to an output terminal of comparator CMP16. Comparator CMP14 compares a voltage of the inverting input terminal and a voltage of the non-inverting input terminal, and outputs a control signal indicating a comparison result to logic circuit 22.

Next, description will be made in detail on an operation of control signal generation unit 24. Here, description will be given based on the assumption that power source voltage VDD is 5 V, and voltages VH, VM, VL are 2 V, 1.4 V, and 0.8 V, respectively.

In the case that control terminals TC11, TC12 are pulled up on an outside of semiconductor device 302, and power source voltage VDD is supplied to control terminals TC11, TC12, power source voltage VDD is supplied to a non-inverting input terminal of each of comparators CMP11-CMP14. Comparators CMP11-CMP14 then output a signal at a logic high level.

In the case that control terminals TC11, TC12 are pulled down on an outside of semiconductor device 302, and ground voltage VSS is supplied to control terminals TC11, TC12, ground voltage VSS is supplied to a non-inverting input terminal of each of comparators CMP11-CMP14. Comparators CMP11-CMP14 then output a signal at a logic low level.

In the case that control terminals TC11, TC12 are open-circuited at an outside of semiconductor device 302, voltage VM is supplied to a non-inverting input terminal of each of comparators CMP11-CMP14, because each of comparators CMP15, CMP16 outputs voltage VM at low impedance. Then comparators CMP11, CMP13 output a signal at a logic low level, and comparators CMP12, CMP14 output a signal at a logic high level.

As such, each of comparators CMP11, CMP12 can output a control signal corresponding to each of the potential states, namely, a logic high level, a logic low level, and high impedance at control terminal TC11. Further, each of comparators CMP13, CMP14 can similarly output a control signal corresponding to each of potential states, namely, a logic high level, a logic low level, and high impedance at control terminal TC12.

In the semiconductor device according to the second embodiment of the present invention, it is possible to accurately detect temperatures in a wide range by suppressing degradation in temperature detection accuracy caused by a leakage current, similarly as in the case of the semiconductor device according to the first embodiment of the present invention.

Accordingly, to be able to select multiple temperatures in a wide temperature range, as temperatures to be detected by semiconductor device 302, it is necessary to increase the number of available choices for comparison voltage VCOMP. However, to increase the number of available choices for comparison voltage VCOMP, it is necessary to increase the bit numbers of the control signal indicating a command to select comparison voltage VCOMP incoming from the outside of semiconductor device 302, resulting in that the number of terminals of semiconductor device 302 that receives this control signal is inevitably increased.

In the semiconductor device according to the second embodiment of the present invention, however, with the above-described configuration, it is possible to generate up to nine types of control signals by providing only two control terminals TC11, TC12. Therefore, it is possible to select multiple temperatures in a wide temperature range, as temperatures to be detected by the semiconductor device, suppress increase in the number of terminals at the semiconductor device, and achieve size reduction.

For example, instead of using the configuration such as control signal generation unit 24, it is possible to conceive a configuration that uses a resistor having a first end connected to power source node VDD and a second end connected to control terminal TC11, and a resistor having a first end connected to ground node VSS and a second end connected to control terminal TC11, to generate intermediate voltage VM. In such a configuration, however, it is necessary to provide resistors having a large resistance value so as to decrease a current flowing through each of the resistors, resulting in that a circuit area of the semiconductor device is inevitably increased. Further, in the configuration in which the above-described two resistors are provided outside the semiconductor device, a circuit area on a substrate where this semiconductor device is mounted is increased, and cost increases.

However, in control signal generation unit 24 in the semiconductor device according to the second embodiment of the present invention, reference voltage VM is supplied to comparators CMP11-CMP14 by the voltage follower circuit. With such a configuration, it is possible to reduce a consumption current as well as a circuit area.

Further, in the semiconductor device according to the second embodiment of the present invention, second reference voltage generation circuit 23 generates reference voltage VM, reference voltage VH, and reference voltage VL based on reference voltage VBG. With such a configuration, it is possible to reduce a consumption current as well as a circuit area. Note that the configuration is not limited to the configuration in which reference voltage VM, reference voltage VH, and reference voltage VL are generated based on reference voltage VBG, and it may also be possible to adopt a configuration in which these voltages are generated based on, for example, power source voltage VDD. Further, it may also be possible to adopt a configuration in which reference voltage VM, reference voltage VH, and reference voltage VL are externally supplied to semiconductor device 302.

Other configurations and operations are similar to those of the semiconductor device according to the first embodiment, and hence the detailed description thereof will not be repeated.

It should be understood that the embodiments disclosed herein are illustrative and not limitative in all aspects. The scope of the present invention is shown not by the description above but by the scope of the claims, and is intended to include all modifications within the equivalent meaning and scope of the claims.

What is claimed is:

1. A semiconductor device, comprising:
a temperature detection element, a voltage to be applied to the temperature detection element so as to allow a current greater than or equal to a prescribed value to flow through the temperature detection element changing in accordance with an ambient temperature;
a constant current source for applying a voltage to said temperature detection element so as to allow a reference current greater than or equal to said prescribed value to flow through said temperature detection element,
said constant current source including
a reference current transistor having a first conductive electrode coupled to a first power source node to which a first power source voltage is supplied, and a second conductive electrode, and outputting said reference current, and
a first diffused resistor,
said first diffused resistor including
a first semiconductor region of a first conductivity type, having a first potential-fixing node coupled to said first power source node, and
a second semiconductor region of a second conductivity type, having a first resistor node coupled to the second conductive electrode of said reference current transistor and a second resistor node coupled to a second power source node to which a second power source voltage is supplied, and formed to be spaced apart from said first potential-fixing node at a surface of said first semiconductor region; and
a first leakage current correction circuit for allowing a current having approximately the same magnitude and the same direction as a magnitude and a direction of a current flowing between said first power source node and said second power source node via said first potential-fixing node and said second resistor node, to flow between said first power source node and said second power source node, not via said first diffused resistor but via said reference current transistor.

2. The semiconductor device according to claim 1, wherein said first leakage current correction circuit includes
a first mirror circuit including a reference-side transistor connected between said first power source node and said first potential-fixing node, and an output-side transistor connected between said first power source node and said second power source node, and a second mirror circuit including a reference-side transistor connected between said first power source node and said second power source node via the output-side transistor in said first mirror circuit, and an output-side transistor connected between the second conductive electrode of said reference current transistor and said second power source node.

3. The semiconductor device according to claim 2, wherein said first diffused resistor further includes a third semiconductor region of the second conductivity type, coupled to said second power source node and having a surface at which said first semiconductor region is formed, and said first leakage current correction circuit further includes a fourth semiconductor region of the first conductivity type, coupled to a node between the output-side transistor in said first mirror circuit and the reference-side transistor in said second mirror circuit, and a fifth semiconductor region of the second conductivity type, coupled to said second power source node and having a surface at which said fourth semiconductor region is formed.

4. The semiconductor device according to claim 3, wherein a value obtained by multiplying a contact area of said first semiconductor region and said third semiconductor region by a mirror ratio of said second mirror circuit is approximately equal to a contact area of said fourth semiconductor region and said fifth semiconductor region.

5. The semiconductor device according to claim 1, wherein said reference current transistor includes a sixth semiconductor region of the second conductivity type, coupled to said second power source node, a seventh semiconductor region of the first conductivity type, formed at a surface of said sixth semiconductor region and coupled to said first power source node, an eighth semiconductor region of the second conductivity type, formed at a surface of said seventh semiconductor region, and a ninth semiconductor region of the first conductivity type, formed at a surface of said eighth semiconductor region and coupled to said first resistor node of said first diffused resistor, and said semiconductor device further comprises a second leakage current correction circuit for allowing a current having approximately the same magnitude and the same direction as a magnitude and a direction of a current flowing between said first power source node and said second power source node via said sixth semiconductor region and said seventh semiconductor region, to flow between said first power source node and said second power source node via said seventh semiconductor region, said eighth semiconductor region, and said ninth semiconductor region.

6. The semiconductor device according to claim 1, wherein said reference current transistor includes a sixth semiconductor region of the second conductivity type, coupled to said second power source node, a seventh semiconductor region of the first conductivity type, formed at a surface of said sixth semiconductor region and coupled to said first power source node, an eighth semiconductor region of the second conductivity type, formed at a surface of said seventh semiconductor region, and a ninth semiconductor region of the first conductivity type, formed at a surface of said eighth semiconductor region and coupled to said first diffused resistor, said semiconductor device further comprises a second leakage current correction circuit, and said second leakage current correction circuit includes a tenth semiconductor region of the first conductivity type, coupled to said first power source node, an eleventh semiconductor region of the second conductivity type, coupled to said second power source node and having a surface at which said tenth semiconductor region is formed, and a third mirror circuit including a reference-side transistor connected between said first power source node and said tenth semiconductor region, and an output-side transistor connected between said first power source node and said seventh semiconductor region.

7. The semiconductor device according to claim 1, wherein said temperature detection element includes a twelfth semiconductor region of the second conductivity type, coupled to said second power source node, a thirteenth semiconductor region of the first conductivity type, formed at a surface of said twelfth semiconductor region and coupled to said first power source node, a fourteenth semiconductor region of the second conductivity type, formed at a surface of said thirteenth semiconductor region and coupled to said first power source node, and a fifteenth semiconductor region of the first conductivity type, formed at a surface of said fourteenth semiconductor region and coupled to said second power source node, and said semiconductor device further comprises a third leakage current correction circuit for allowing a current having approximately the same magnitude and the same direction as a magnitude and a direction of a current flowing between said first power source node and said second power source node via said twelfth semiconductor region and said thirteenth semiconductor region, to flow between said first power source node and said second power source node via said fourteenth semiconductor region and said fifteenth semiconductor region.

8. The semiconductor device according to claim 1, wherein said temperature detection element includes a twelfth semiconductor region of the second conductivity type, coupled to said second power source node, a thirteenth semiconductor region of the first conductivity type, formed at a surface of said twelfth semiconductor region and coupled to said first power source node, a fourteenth semiconductor region of the second conductivity type, formed at a surface of said thirteenth semiconductor region and coupled to said first power source node, and a fifteenth semiconductor region of the first conductivity type, formed at a surface of said fourteenth semiconductor region and coupled to said second power source node, said semiconductor device further comprises a third leakage current correction circuit, and said third leakage current correction circuit includes a sixteenth semiconductor region of the first conductivity type, coupled to said first power source node, a seventeenth semiconductor region of the second conductivity type, coupled to said second power source node and having a surface at which said sixteenth semiconductor region is formed, and a fourth mirror circuit having a reference-side transistor connected between said first power source node and said sixteenth semiconductor region, and an output-side transistor connected between said first power source node, and said thirteenth semiconductor region and said fourteenth semiconductor region.

9. The semiconductor device according to claim 1, wherein said semiconductor device further comprises a second diffused resistor for converting said reference current to generate a reference voltage,
said second diffused resistor includes
an eighteenth semiconductor region of the first conductivity type, having a second potential-fixing node coupled to said first power source node, and
a nineteenth semiconductor region of the second conductivity type, having a third resistor node coupled to said reference current transistor and a fourth resistor node coupled to the second power source node to which the second power source voltage is supplied, and formed to be spaced apart from said second potential-fixing node at a surface of said eighteenth semiconductor region, and
said semiconductor device further comprises a fourth leakage current correction circuit for allowing a current having approximately the same magnitude and the same direction as a magnitude and a direction of a current flowing between said first power source node and said second power source node via said second potential-fixing node and said fourth resistor node, to flow between said first power source node and said second power source node, not via said fourth resistor node but via said third resistor node.

10. The semiconductor device according to claim 9, wherein
said fourth leakage current correction circuit includes
a fifth mirror circuit having a reference-side transistor connected between said first power source node and said second potential-fixing node, and an output-side transistor connected between said first power source node and said second power source node, and
a sixth mirror circuit having a reference-side transistor connected between said first power source node and said second power source node via the output-side transistor in said fifth mirror circuit, and an output-side transistor connected between said third resistor node and said second power source node.

11. The semiconductor device according to claim 10, wherein
said second diffused resistor further includes a twentieth semiconductor region of the second conductivity type, coupled to said second power source node and having a surface at which said eighteenth semiconductor region is formed,
said fourth leakage current correction circuit further includes
a twenty-first semiconductor region of the first conductivity type, coupled to a node between the output-side transistor in said fifth mirror circuit and the reference-side transistor in said sixth mirror circuit, and
a twenty-second semiconductor region of the second conductivity type, coupled to said second power source node and having a surface at which said twenty-first semiconductor region is formed.

12. The semiconductor device according to claim 9, wherein
said first leakage current correction circuit and said fourth leakage current correction circuit include
a first mirror circuit having a reference-side transistor connected between said first power source node, and said first potential-fixing node and said second potential-fixing node, and a first output-side transistor connected between said first power source node and said second power source node, and
a second mirror circuit having a reference-side transistor connected between said first power source node and said second power source node via the output-side transistor in said first mirror circuit, a first output-side transistor connected between the second conductive electrode of said reference current transistor and said second power source node, and a second output-side transistor connected between said third resistor node and said second power source node.

13. The semiconductor device according to claim 1, further comprising
a first reference voltage generation circuit for generating a first reference voltage based on said reference current,
a second reference voltage generation circuit for generating a plurality of second reference voltages based on said first reference voltage,
a reference voltage selection circuit for selecting any one of said plurality of second reference voltages, and
a comparison unit for comparing the voltage applied to said temperature detection element by said constant current source with said selected second reference voltage.

14. The semiconductor device according to claim 13, further comprising
a control terminal, and
a control signal generation circuit for generating a control signal based on a potential state of said control terminal, wherein
said control signal generation circuit includes
a voltage follower circuit having an input terminal for receiving an intermediate voltage and an output terminal coupled to said control terminal,
a first comparator circuit having a first input terminal for receiving a first control voltage higher than said intermediate voltage, and a second input terminal coupled to the output terminal of said voltage follower circuit, comparing a voltage of said first input terminal with a voltage of said second input terminal, and outputting a first control signal indicating the comparison result to said reference voltage selection circuit, and
a second comparator circuit having a first input terminal for receiving a second control voltage lower than said intermediate voltage, and a second input terminal coupled to the output terminal of said voltage follower circuit, comparing a voltage of said first input terminal with a voltage of said second input terminal, and outputting a second control signal indicating the comparison result to said reference voltage selection circuit, and
said reference voltage selection circuit selects any one of said plurality of second reference voltages based on said first control signal and said second control signal.

15. The semiconductor device according to claim 14, wherein said second reference voltage generation circuit further generates said intermediate voltage, said first control voltage, and said second control voltage based on said first reference voltage.

16. A semiconductor device, comprising:
a temperature detection element, a voltage to be applied to the temperature detection element so as to allow a current greater than or equal to a prescribed value to flow through the temperature detection element changing in accordance with an ambient temperature,
a constant current source for applying a voltage to said temperature detection element so as to allow a reference current greater than or equal to said prescribed value to flow through said temperature detection element;

a diffused resistor for converting said reference current to generate a reference voltage, said diffused resistor including a first semiconductor region of a first conductivity type, having a potential-fixing node coupled to a first power source node to which a first power source voltage is supplied, and a second semiconductor region of a second conductivity type, having a first resistor node coupled to said reference current transistor and a second resistor node coupled to a second power source node to which a second power source voltage is supplied, and formed to be spaced apart from said potential-fixing node at a surface of said first semiconductor region; and a leakage current correction circuit for allowing a current having approximately the same magnitude and the same direction as a magnitude and a direction of a current flowing between said first power source node and said second power source node via said potential-fixing node and said second resistor node, to flow between said first power source node and said second power source node, not via said second resistor node but via said first resistor node.

17. A power source, comprising:
a voltage generation circuit; and
a semiconductor device for detecting a temperature of said voltage generation circuit, said semiconductor device including a temperature detection element, a voltage to be applied to the temperature detection element so as to allow a current greater than or equal to a prescribed value to flow through the temperature detection element changing in accordance with an ambient temperature, and a constant current source for applying a voltage to said temperature detection element so as to allow a reference current greater than or equal to said prescribed value to flow through said temperature detection element, said constant current source including a reference current transistor having a first conductive electrode coupled to a first power source node to which a first power source voltage is supplied, and a second conductive electrode, and outputting said reference current, and a diffused resistor, said diffused resistor including a first semiconductor region of a first conductivity type, having a potential-fixing node coupled to said first power source node, and a second semiconductor region of a second conductivity type, having a first resistor node coupled to the second conductive electrode of said reference current transistor and a second resistor node coupled to a second power source node to which a second power source voltage is supplied, and formed to be spaced apart from said potential-fixing node at a surface of said first semiconductor region, and said semiconductor device further including a leakage current correction circuit for allowing a current having approximately the same magnitude and the same direction as a magnitude and a direction of a current flowing between said first power source node and said second power source node via said potential-fixing node and said second resistor node, to flow between said first power source node and said second power source node, not via said diffused resistor but via said reference current transistor.

18. A processor, comprising:
a CPU; and
a semiconductor device for detecting a temperature of said CPU, said semiconductor device including a temperature detection element, a voltage to be applied to the temperature detection element so as to allow a current greater than or equal to a prescribed value to flow through the temperature detection element changing in accordance with an ambient temperature, and a constant current source for applying a voltage to said temperature detection element so as to allow a reference current greater than or equal to said prescribed value to flow through said temperature detection element, said constant current source including a reference current transistor having a first conductive electrode coupled to a first power source node to which a first power source voltage is supplied, and a second conductive electrode, and outputting said reference current, and a diffused resistor, said diffused resistor including a first semiconductor region of a first conductivity type, having a potential-fixing node coupled to said first power source node, and a second semiconductor region of a second conductivity type, having a first resistor node coupled to the second conductive electrode of said reference current transistor and a second resistor node coupled to a second power source node to which a second power source voltage is supplied, and formed to be spaced apart from said potential-fixing node at a surface of said first semiconductor region, and said semiconductor device further including a leakage current correction circuit for allowing a current having approximately the same magnitude and the same direction as a magnitude and a direction of a current flowing between said first power source node and said second power source node via said potential-fixing node and said second resistor node, to flow between said first power source node and said second power source node, not via said diffused resistor but via said reference current transistor.

* * * * *